(12) United States Patent
Jeong et al.

(10) Patent No.: US 11,145,723 B2
(45) Date of Patent: Oct. 12, 2021

(54) SEMICONDUCTOR DEVICE

(71) Applicant: SAMSUNG ELECTRONICS CO., LTD., Suwon-si (KR)

(72) Inventors: Seojin Jeong, Incheon (KR); Jinyeong Joe, Suwon-si (KR); Seokhoon Kim, Suwon-si (KR); Jeongho Yoo, Seongnam-si (KR); Seung Hun Lee, Hwaseong-si (KR); Sihyung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 112 days.

(21) Appl. No.: 16/720,363

(22) Filed: Dec. 19, 2019

(65) Prior Publication Data

US 2020/0388682 A1    Dec. 10, 2020

(30) Foreign Application Priority Data

Jun. 7, 2019   (KR) ................. 10-2019-0067504

(51) Int. Cl.
*H01L 29/16*    (2006.01)
*H01L 29/10*    (2006.01)
(Continued)

(52) U.S. Cl.
CPC .... *H01L 29/1604* (2013.01); *H01L 21/76224* (2013.01); *H01L 21/823807* (2013.01); *H01L 21/823814* (2013.01); *H01L 21/823821* (2013.01); *H01L 21/823878* (2013.01); *H01L 27/0924* (2013.01); *H01L 29/04* (2013.01);
(Continued)

(58) Field of Classification Search
CPC . H01L 29/1604; H01L 29/1033; H01L 29/04; H01L 29/167; H01L 29/36; H01L 27/0924; H01L 29/0673; H01L 21/823878; H01L 21/823814; H01L 21/823821; H01L 21/823807; H01L 21/76224; H01L 29/66636; H01L 29/0847; H01L 29/66545; H01L 21/02532; H01L 21/02636; H01L 21/02592; H01L 29/6656; H01L 21/823864; H01L 29/7848; H01L 29/165;
(Continued)

(56) References Cited

U.S. PATENT DOCUMENTS 7,045,407 B2   5/2006  Keating et al.
8,551,845 B2   10/2013 Chan et al.
(Continued)

*Primary Examiner* — Sheikh Maruf
(74) *Attorney, Agent, or Firm* — Lee IP Law, P.C.

(57) ABSTRACT

A semiconductor device includes a substrate, a device isolation layer on the substrate, the device isolation layer defining a first active pattern, a pair of first source/drain patterns on the first active pattern, the pair of first source/drain patterns being spaced apart from each other in a first direction, and each of the pair of first source/drain patterns having a maximum first width in the first direction, a first channel pattern between the pair of first source/drain patterns, a gate electrode on the first channel pattern and extends in a second direction intersecting the first direction, and a first amorphous region in the first active pattern, the first amorphous region being below at least one of the pair of first source/drain patterns, and having a maximum second width in the first direction that is less than the maximum first width.

20 Claims, 37 Drawing Sheets

(51) Int. Cl.
*H01L 29/04* (2006.01)
*H01L 29/167* (2006.01)
*H01L 29/36* (2006.01)
*H01L 27/092* (2006.01)
*H01L 29/06* (2006.01)
*H01L 21/8238* (2006.01)
*H01L 21/762* (2006.01)
*H01L 29/66* (2006.01)
*H01L 29/08* (2006.01)
*H01L 21/02* (2006.01)

(52) U.S. Cl.
CPC ...... *H01L 29/0673* (2013.01); *H01L 29/0847* (2013.01); *H01L 29/1033* (2013.01); *H01L 29/167* (2013.01); *H01L 29/36* (2013.01); *H01L 29/66636* (2013.01); *H01L 21/02532* (2013.01); *H01L 21/02592* (2013.01); *H01L 21/02636* (2013.01); *H01L 21/823864* (2013.01); *H01L 29/6656* (2013.01); *H01L 29/66545* (2013.01)

(58) Field of Classification Search
CPC . H01L 29/78; H01L 29/0603; H01L 29/0684; H01L 27/0207
USPC .......................................................... 257/51
See application file for complete search history.

(56) References Cited

U.S. PATENT DOCUMENTS

| | | | |
|---|---|---|---|
| 9,293,534 | B2 | 3/2016 | Tsai et al. |
| 9,530,870 | B2 | 12/2016 | Yoon et al. |
| 9,722,080 | B2 | 8/2017 | Liou et al. |
| 10,170,554 | B2 | 1/2019 | Hsieh et al. |
| 2006/0060848 | A1* | 3/2006 | Chang ............... H01L 21/02532 257/52 |
| 2008/0070384 | A1* | 3/2008 | Murthy ............. H01L 29/66628 438/482 |
| 2009/0065816 | A1* | 3/2009 | Cunningham ...... H01L 29/7845 257/255 |
| 2009/0166625 | A1* | 7/2009 | Ting .................... H01L 29/7834 257/51 |
| 2013/0299910 | A1* | 11/2013 | Cheng ............. H01L 21/823814 257/368 |
| 2015/0084095 | A1* | 3/2015 | Fenouillet-Beranger ................... H01L 21/30604 257/192 |
| 2016/0190249 | A1* | 6/2016 | Hsieh .............. H01L 21/823814 257/51 |
| 2017/0125590 | A1* | 5/2017 | Doris ................. H01L 29/0649 |
| 2017/0141229 | A1* | 5/2017 | Liou ...................... H01L 29/32 |
| 2018/0337283 | A1* | 11/2018 | Li ...................... H01L 29/0653 |
| 2019/0273133 | A1* | 9/2019 | Agrawal ................. H01L 29/45 |

* cited by examiner

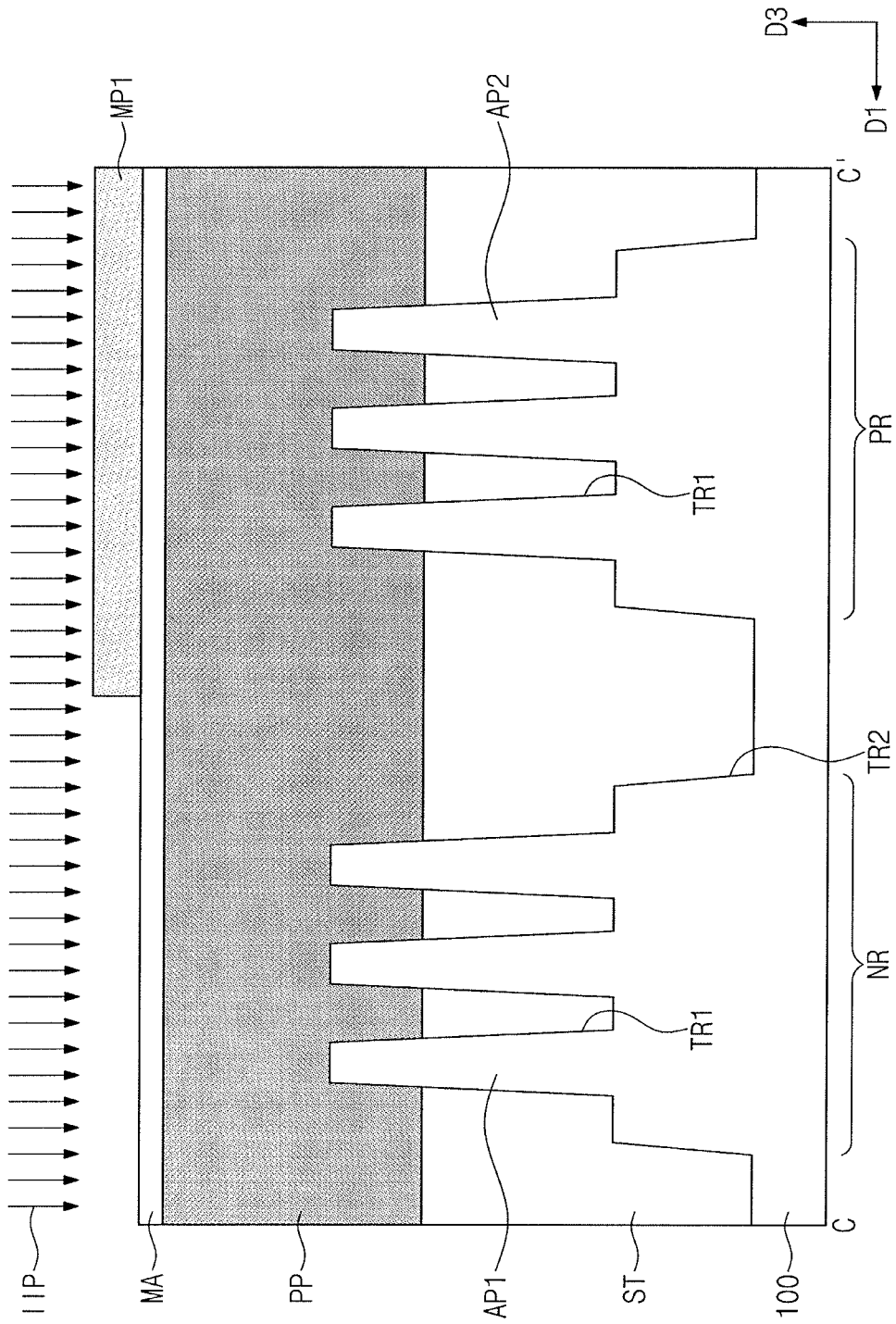

SEMICONDUCTOR DEVICE

CROSS-REFERENCE TO RELATED APPLICATION

Korean Patent Application No. 10-2019-0067504, filed on Jun. 7, 2019, in the Korean Intellectual Property Office, and entitled: "Semiconductor Device," is incorporated by reference herein in its entirety.

BACKGROUND

1. Field

The present disclosure relates to a semiconductor device, and more particularly, to a semiconductor device including a field effect transistor and a method of fabricating the same.

2. Description of the Related Art

A semiconductor device may include an integrated circuit with metal oxide semiconductor field effect transistors (MOSFETs). As sizes and design rules of the semiconductor device are gradually decreased, sizes of the MOSFETs are also increasingly scaled down. However, the scale down of MOSFETs may deteriorate operating characteristics of the semiconductor device. Accordingly, various researches have been developed to fabricate semiconductor devices having superior performances while overcoming limitations due to high integration of the semiconductor devices.

SUMMARY

According to some example embodiments, a semiconductor device may include a substrate, a device isolation layer on the substrate, the device isolation layer defining a first active pattern, a pair of first source/drain patterns on the first active pattern, the pair of first source/drain patterns being spaced apart from each other in a first direction, and each of the pair of first source/drain patterns having a maximum first width in the first direction, a first channel pattern between the pair of first source/drain patterns, a gate electrode on the first channel pattern and extends in a second direction intersecting the first direction, and a first amorphous region in the first active pattern, the first amorphous region being below at least one of the pair of first source/drain patterns, and the first amorphous region having a maximum second width in the first direction that is less than the maximum first width.

According to some example embodiments, a semiconductor device may include a substrate, a device isolation layer on the substrate, the device isolation layer defining a first active pattern, and the active pattern extending in a first direction, a channel pattern on the active pattern, a top surface of the channel pattern being higher than a top surface of the device isolation layer, a source/drain pattern on the active pattern, the source/drain pattern including a region with a maximum first width in the first direction, and the source/drain pattern being in direct contact with the channel pattern, a gate electrode on the channel pattern and extends in a second direction intersecting the first direction, and an amorphous region in the active pattern, the amorphous region being below the source/drain pattern.

According to some example embodiments, a semiconductor device may include a substrate, a device isolation layer that is on the substrate and defines an active pattern, an upper portion of the active pattern vertically protruding beyond the device isolation layer, a pair of source/drain patterns on the upper portion of the active pattern, the pair of source/drain patterns being spaced apart from each other in a first direction, a channel pattern between the pair of source/drain patterns, a gate electrode on a top surface and opposite sidewalls of the channel pattern, the gate electrode extending in a second direction intersecting the first direction, a gate dielectric layer between the channel pattern and the gate electrode, the gate dielectric layer covering the top surface and the opposite sidewalls of the channel pattern, and an active contact electrically connected to at least one source/drain pattern. The active pattern may include an amorphous region below the at least one source/drain pattern. A first width may be given as a maximum width in the first direction of the at least one source/drain pattern. A second width may be given as a maximum width in the first direction of the amorphous region. The second width may be less than the first width.

BRIEF DESCRIPTION OF THE DRAWINGS

Features will become apparent to those of skill in the art by describing in detail exemplary embodiments with reference to the attached drawings, in which:

FIGS. 6C, 8C, 10C, 12C, and 14C illustrate cross-sectional views taken along line C-C' of FIGS. 5, 7, 9, 11, and 13, respectively.

DETAILED DESCRIPTION

Figure 1:
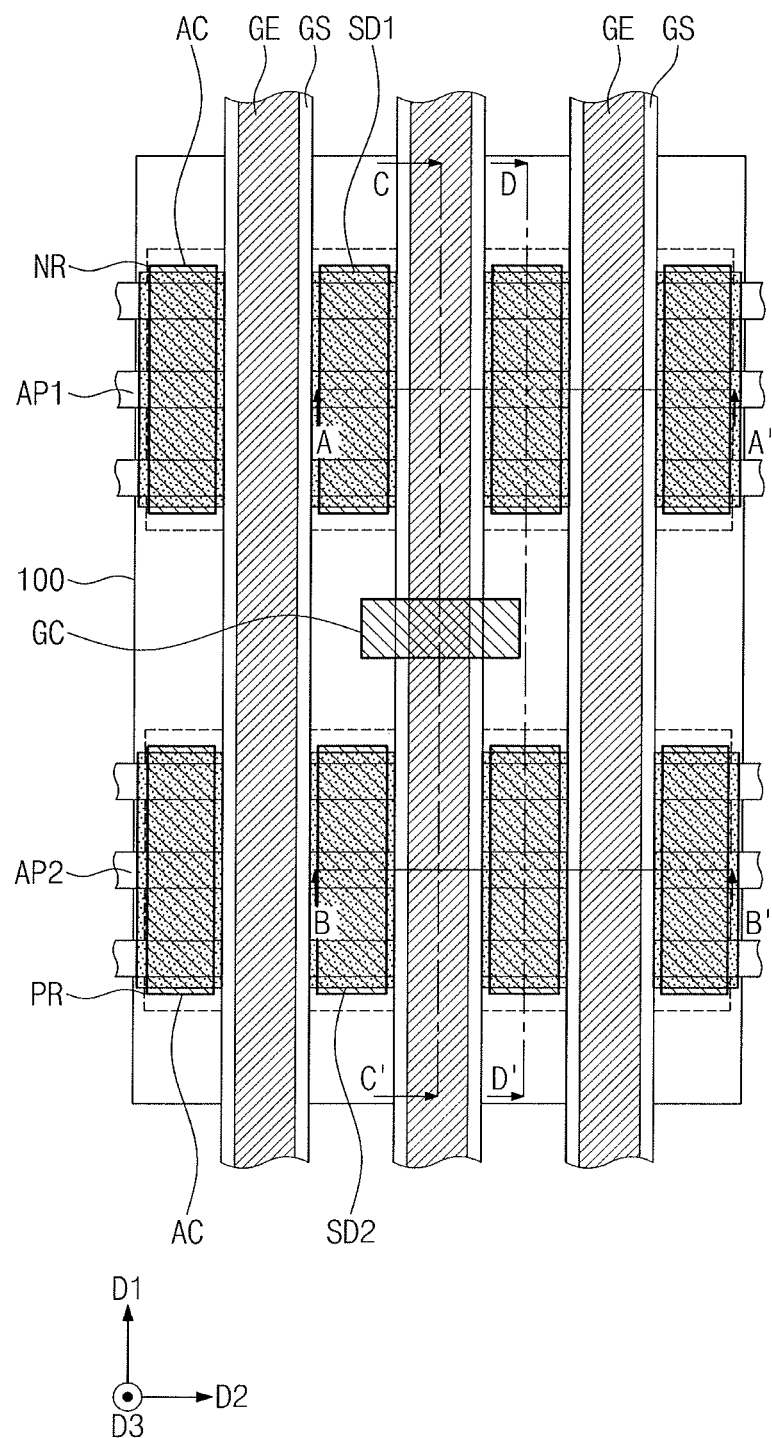
FIG. 1 illustrates a plan view of a semiconductor device according to some example embodiments.

FIG. 1 illustrates a plan view showing a semiconductor device according to some example embodiments. FIGS. 2A, 2B, 2C, and 2D illustrate cross-sectional views respectively taken along lines A-A', B-B', C-C', and D-D' of FIG. 1.

Referring to FIGS. 1 and 2A to 2D, a substrate 100 with a first active region NR and a second active region PR may be provided. The substrate 100 may be a compound semiconductor substrate or a semiconductor substrate including, e.g., silicon, germanium, silicon-germanium, or the like. For example, the substrate 100 may be a silicon substrate.

In certain embodiments, the first active region NR may be an NMOSFET region, and the second active region PR may be a PMOSFET region. The first active region NR and the second active region PR may be included in a logic cell region where logic transistors are disposed to constitute a logic circuit of a semiconductor device. For example, logic transistors constituting a logic circuit may be disposed on the logic cell region of the substrate 100. The first active region NR and the second active region PR may include one or more of the logic transistors.

Figure 2A:
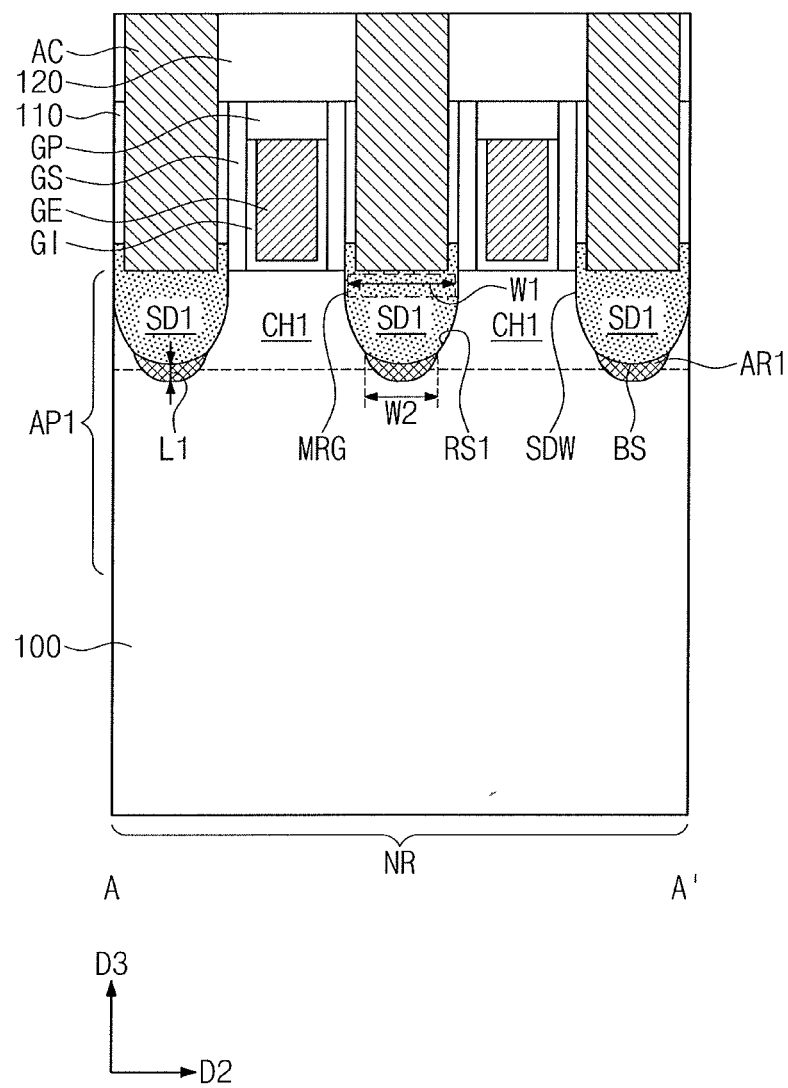
FIGS. 2A, 2B, 2C, and 2D illustrate cross-sectional views respectively taken along lines A-A', B-B', C-C', and D-D' of FIG. 1.
Figure 2B:
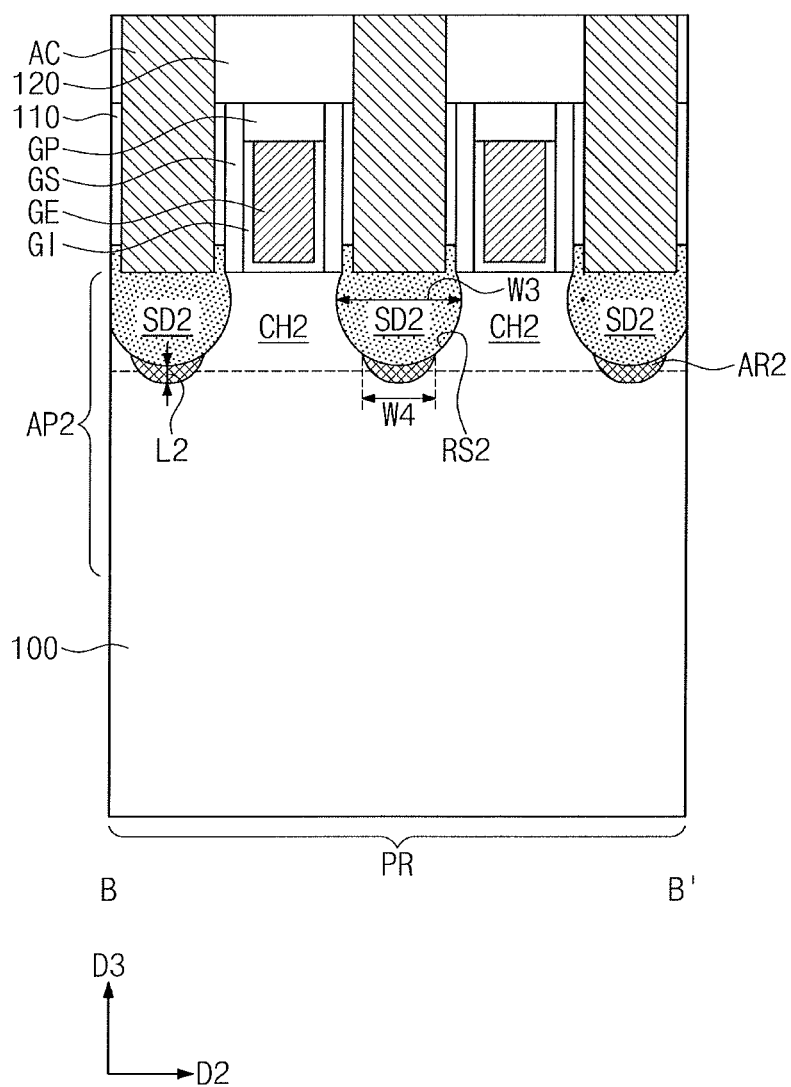
Figure 2C:
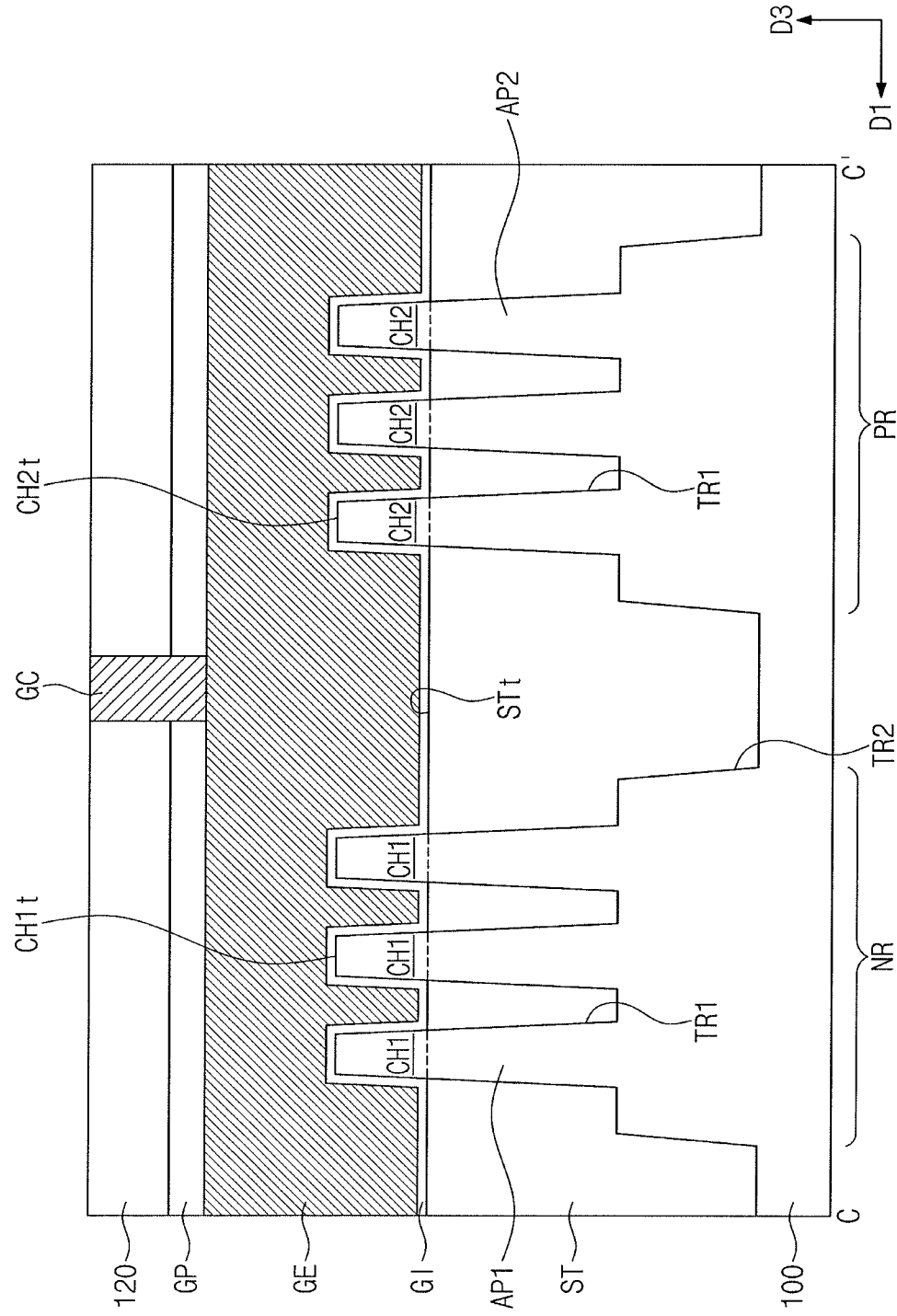
Figure 2D:
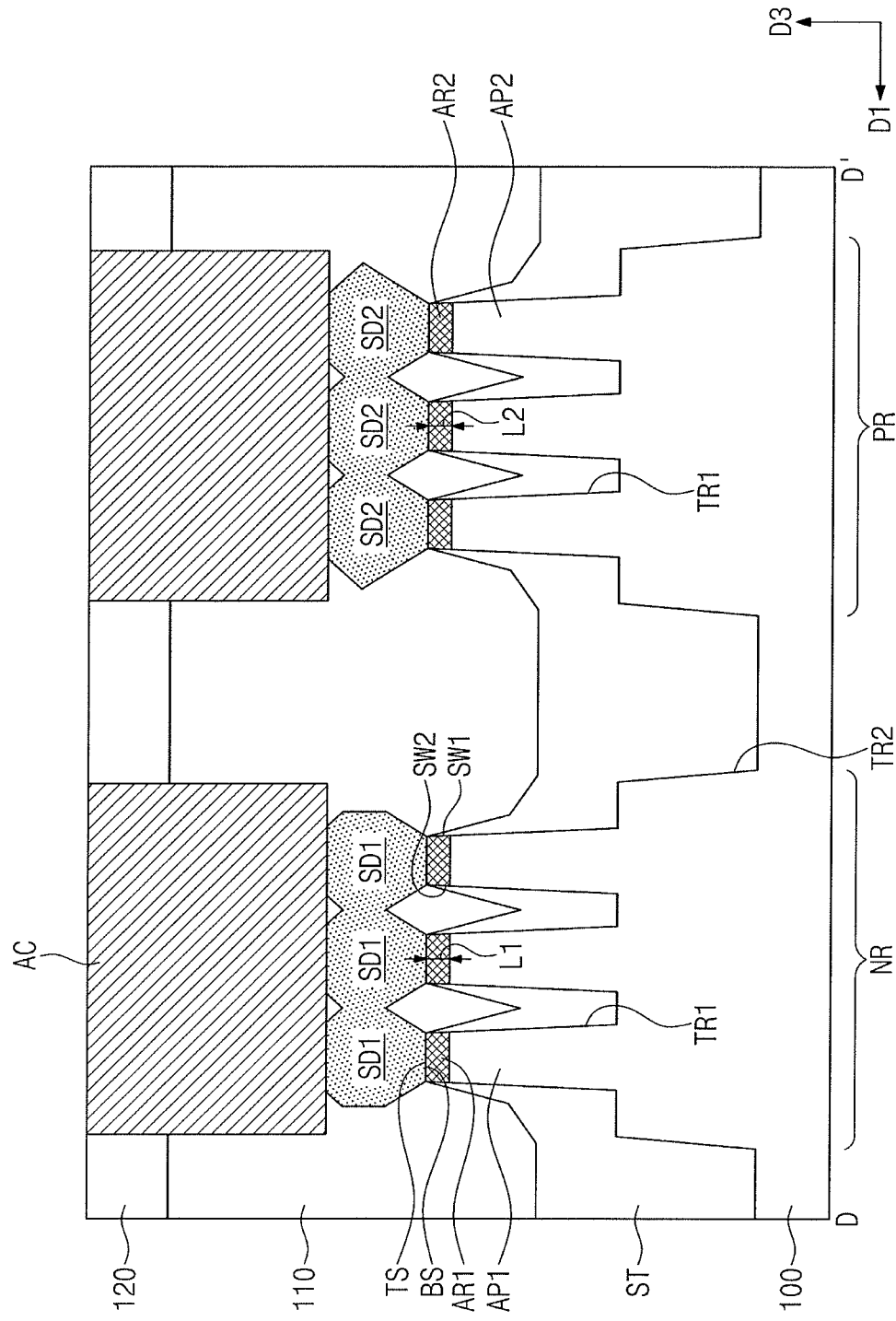

The first active region NR and the second active region PR may be defined by a second trench TR2 formed on an upper portion of the substrate 100. The second trench TR2 may be positioned between the first active region NR and the second active region PR, as illustrated in FIGS. 2C and 2D. The first active region NR and the second active region PR may be spaced apart from each other in a first direction D1 across the second trench TR2. Each of the first and second active regions NR and PR may extend in a second direction D2 intersecting the first direction D1.

First active patterns AP1 and second active patterns AP2 may be provided on the first active region NR and the second active region PR, respectively. The first and second active patterns AP1 and AP2 may extend in the second direction D2. The first and second active patterns AP1 and AP2 may be vertically protruding portions of the substrate 100. A first trench TR1 may be defined between adjacent first active patterns AP1 and between adjacent second active patterns AP2. The first trench TR1 may be shallower than the second trench TR2, e.g., the second trench TR2 may be deeper than the first trench TR1 to have a distance between a bottom of the substrate 100 and a bottom of the second trench TR2 smaller than a distance between the bottom of the substrate 100 and a bottom of the first trench TR1.

A device isolation layer ST may fill the first and second trenches TR1 and TR2. The device isolation layer ST may include, e.g., a silicon oxide layer. The first and second active patterns AP1 and AP2 may have their upper portions that vertically protrude beyond, e.g., above, the device isolation layer ST, e.g., along a third direction D3 (see FIG. 2C). Each of the upper portions of the first and second active patterns AP1 and AP2 may have a fin shape. The device isolation layer ST may not cover the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. First recesses RS1 may be formed on the upper portion of each of the first active patterns AP1, and the first source/drain patterns SD1 may correspondingly fill the first recesses RS1 (FIG. 2A). The first source/drain patterns SD1 may be impurity regions of a first conductive type (e.g., n-type). The first source/drain patterns SD1 may include first conductive type impurities (e.g., phosphorus (P)). A first channel pattern CH1 may be interposed between a pair of first source/drain patterns SD1.

Second source/drain patterns SD2 may be provided on the upper portions of the second active patterns AP2. Second recesses RS2 may be formed on the upper portion of each of the second active patterns AP2, and the second source/drain patterns SD2 may correspondingly fill the second recesses RS2 (FIG. 2B). The second source/drain patterns SD2 may be impurity regions of a second conductive type (e.g., p-type). The second source/drain patterns SD2 may include second conductive type impurities (e.g., boron (B)). A second channel pattern CH2 may be interposed between a pair of second source/drain patterns SD2.

The first and second source/drain patterns SD1 and SD2 may be epitaxial patterns formed by a selective epitaxial growth process. The first and second source/drain patterns SD1 and SD2 may have their top surfaces at a higher level than that of top surfaces of the first and second channel patterns CH1 and CH2. For example, the first source/drain patterns SD1 may include the same semiconductor element (e.g., Si) as that of the substrate 100. For example, the second source/drain patterns SD2 may include a semiconductor element (e.g., SiGe) having a lattice constant that is greater than that of the semiconductor element of the substrate 100. Therefore, the second source/drain patterns SD2 may provide the second channel patterns CH2 with a compressive stress.

The first and second channel patterns CH1 and CH2 may be provided at a higher level than that of the device isolation layer ST. For example, the first channel pattern CH1 may have a top surface CH1$t$ higher than a top surface STt of the device isolation layer ST (FIG. 2C). The second channel pattern CH2 may have a top surface CH2$t$ higher than the top surface STt of the device isolation layer ST (FIG. 2C). According to some example embodiments, the first and second channel patterns CH1 and CH2 may have a three-dimensional structure on the device isolation layer ST, and thus a three-dimensional transistor (3D FET) may be achieved.

The first active pattern AP1 may include first amorphous regions AR1 below corresponding first source/drain patterns SD1, as illustrated in FIGS. 2A and 2D. The first amorphous region AR1 may be in direct contact with a bottom surface BS of the first source/drain pattern SD1. The first amorphous region AR1 may have a top surface TS in direct contact with the bottom surface BS of the first source/drain pattern SD1 (see FIG. 2D). The first amorphous region AR1 may extend from the bottom surface BS of the first source/drain pattern SD1 toward a bottom surface of the substrate 100. The first amorphous region AR1 may vertically overlap the first source/drain pattern SD1.

The first amorphous region AR1 may be positioned restrictedly on the bottom surface BS of the first source/drain pattern SD1. The first amorphous region AR1 may not extend onto a sidewall SDW of the first source/drain pattern SD1 (e.g., FIG. 2D). For example, the first amorphous region AR1 may be formed at the bottom of the first source/drain pattern SD1, such that the first channel pattern CH1 may be in direct contact with, e.g., a majority of, the sidewall SDW of the first source/drain pattern SD1 (FIG. 2A). For example, as illustrated in FIG. 2A, the first amorphous region AR1 may be centered at the bottom of the first source/drain pattern SD1, such that the first source/drain pattern SD1 may extend beyond edges of the first amorphous region AR1 in the second direction D2, e.g., side portions (e.g., sidewalls) of the first source/drain pattern SD1 may overhang edges of the first amorphous region AR1 in the second direction D2.

A first width W1 may be defined as a maximum width in the second direction D2 of the first source/drain pattern SD1. A second width W2 may be defined as a maximum width in the second direction D2 of the first amorphous region AR1. The second width W2 may be less than the first width W1. For example, as illustrated in FIGS. 2A and 2D, a maximal width of the first source/drain pattern SD1 may be larger than that of the first amorphous region AR1 in each of the first and second directions D1 and D2. A first thickness L1 may be defined as a maximum thickness in the third direction D3 of the first amorphous region AR1.

The first sourced/drain pattern SD1 may have the maximum width W1 in the second direction D2 on a region MRG thereof. In other words, as illustrated in FIG. 2A, the first source/drain pattern SD1 may include the region MRG directly under an active contact AC inserted in the first source/drain pattern SD1 (e.g., exemplary dashed rectangle in the first source/drain pattern SD1), such that the region MRG may be a region of the first source/drain pattern SD1 with the maximum width W1 in the second direction D2, e.g., facing sidewalls of the region MRG spaced apart from each other in the second direction D2 may be substantially perpendicular to the bottom of the substrate 100 to maintain a substantially constant maximum width W1 therebetween. The first amorphous region AR1 may be excluded from a region between the first channel pattern CH1 and the region MRG of the first source/drain pattern SD1, e.g., the first channel pattern CH1 may be in direct contact with the region MRG of the first source/drain pattern SD1.

The first amorphous region AR1 may have a first sidewall SW1 and a second sidewall SW2 that are opposite to each other, e.g., and are spaced apart from each other, in the first direction D1 (see FIG. 2D). The first sidewall SW1 and the second sidewall SW2 may be correspondingly aligned with opposite sidewalls in the first direction D1 of the first active pattern AP1. The first and second sidewalls SW1 and SW2 may be covered with the device isolation layer ST. For example, a dielectric material may cover the first and second sidewalls SW1 and SW2. The first source/drain pattern SD1 may be spaced apart from the first and second sidewalls SW1 and SW2, e.g., the first source/drain pattern SD1 may be in direct contact with the top surface TS of the first amorphous region AR1 without directly contacting the first and second sidewalls SW1 and SW2.

The first amorphous region AR1 may include an amorphous semiconductor material. The first amorphous region AR1 may include the same semiconductor material as that of the first active pattern AP1, e.g., the first amorphous region AR1 and the first active pattern AP1 may include a same semiconductor material in different crystallinity states, i.e., different structures. That is, while the first amorphous region AR1 may include an amorphous semiconductor material, the semiconductor material of the first active pattern AP1 may not be amorphous but may be single crystalline. For example, the first active pattern AP1 may include single crystalline silicon, the first source/drain patterns SD1 may include single crystalline silicon, and the first amorphous region AR1 may include amorphous silicon.

The first amorphous region AR1 may include a first dopant, e.g., at least one of As, Ge, P, C, Si, N, and a combination thereof. For example, the first dopant may be arsenic (As). The first dopant contained in, e.g., within, the first amorphous region AR1 may have a concentration ranging from about $1E19/cm^3$ to about $1E22/cm^3$.

The first dopant around the first amorphous region AR1, e.g., the first dopant adjacent but outside the first amorphous region AR1, may have an extremely low concentration. That is, the first dopant contained in the first amorphous region AR1 may hardly diffuse around, e.g., outside, the first amorphous region AR1. For example, the first dopant contained in the first source/drain pattern SD1 may have a concentration of less than $1E16/cm^3$. The first dopant contained in the first active pattern AP1 below the first amorphous region AR1 may have a concentration of less than $1E16/cm^3$.

The second active patterns AP2 may include second amorphous regions AR2 below corresponding second source/drain patterns SD2, respectively. In the following description, omission will be made to avoid explanation duplicate to those discussed previously with respect the first amorphous region AR1.

A third width W3 may be defined as a maximum width in the second direction D2 of the second source/drain pattern SD2. A fourth width W4 may be defined as a maximum width in the second direction D2 of the second amorphous region AR2. The fourth width W4 may be less than the third width W3. For example, as illustrated in FIGS. 2B and 2D, a maximal width of the second source/drain pattern SD2 may be larger than that of the second amorphous region AR2 in each of the first and second directions D1 and D2. A second thickness L2 may be defined as a maximum thickness in the third direction D3 of the second amorphous region AR2.

The fourth width W4 of the second amorphous region AR2 may be the same as or different from the first width W1 of the first amorphous region AR1. For example, the fourth width W4 of the second amorphous region AR2 may be greater than the first width W1 of the first amorphous region AR1. The second thickness L2 of the second amorphous region AR2 may be the same as or different from the first thickness L1 of the first amorphous region AR1.

The second amorphous region AR2 may include an amorphous semiconductor material. The second amorphous region AR2 may include the same semiconductor material as that of the second active pattern AP2. The semiconductor material of the second active pattern AP2 may not be amorphous, but may be single crystalline. For example, the second active pattern AP2 may include single crystalline silicon, the second source/drain pattern SD2 may include single crystalline silicon-germanium, and the second amorphous region AR2 may include amorphous silicon.

The second amorphous region AR2 may include a second dopant. The second dopant may be the same as or different from the first dopant of the first amorphous region AR1. The second dopant may be, e.g., Ge, C, N, and a combination thereof. The second dopant contained in the second amorphous region AR2 may have a concentration ranging from about $1E19/cm^3$ to about $1E22/cm^3$. The second dopant around, e.g., adjacent but outside, the second amorphous region AR2 may have an extremely low concentration. The second dopant contained in the second amorphous region AR2 may hardly diffuse around the second amorphous region AR2.

Gate electrodes GE may be provided to extend in the first direction D1 and to run across the first and second active patterns AP1 and AP2. The gate electrodes GE may be spaced apart from each other in the second direction D2. The gate electrodes GE may vertically overlap the first and second channel patterns CH1 and CH2. Each of the gate electrodes GE may be provided on a top surface and opposite sidewalls of each of the first and second channel patterns CH1 and CH2 (see FIG. 2C). For example, the gate electrodes GE may include one or more of conductive metal nitride (e.g., titanium nitride or tantalum nitride) and metal (e.g., titanium, tantalum, tungsten, copper, or aluminum).

As illustrated in FIG. 1, a pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE, as illustrated in FIG. 2A. The top surfaces of the gate spacers GS may be coplanar with that of a first interlayer dielectric layer 110 which will be discussed below. For example, the gate spacers GS may include one or more of, e.g., SiCN, SiCON, and SiN. In another example, the gate spacers GS may include a multi-layer consisting of two or more of, e.g., SiCN, SiCON, and SiN.

As illustrated in FIGS. 2A and 2B, a gate capping pattern GP may be provided on each of the gate electrodes GE. The gate capping pattern GP may extend in the first direction D1 along the, e.g., entirety of a top surface of the, gate electrode GE. The gate capping pattern GP may include a material having an etch selectivity with respect to first and second interlayer dielectric layers 110 and 120 which will be discussed below. For example, the gate capping pattern GP may include one or more of SiON, SiCN, SiCON, and SiN.

A gate dielectric layer GI may be interposed between the gate electrode GE and the first active pattern AP1, and between the gate electrode GE and the second active pattern AP2. The gate dielectric layer GI may extend along a bottom surface of the gate electrode GE and along sidewalls thereof. For example, as illustrated in FIG. 2C, the gate dielectric layer GI may cover the top surface and opposite sidewalls of the first channel pattern CH1. The gate dielectric layer GI may cover the top surface and opposite sidewalls of the second channel pattern CH2.

The gate dielectric layer GI may include a high-k dielectric material having a dielectric constant that is greater than that of a silicon oxide layer. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the gate capping patterns GP. For example, the first and second interlayer dielectric layers 110 and 120 may include a silicon oxide layer.

As illustrated in FIG. 1, one or more active contacts AC may be provided between a pair of gate electrodes GE. As illustrated in FIGS. 2A-2B and 2D, the active contacts AC may penetrate the first and second interlayer dielectric layers 110 and 120, and may have an electrical connection with the first and second source/drain patterns SD1 and SD2. The active contact AC may include at least one metallic material, e.g., aluminum, copper, tungsten, molybdenum, and cobalt.

Silicide layers may be interposed between each of the active contact AC and a corresponding one of the first and second source/drain patterns SD1 and SD2. The active contacts AC may be electrically connected through the silicide layers to the first and second source/drain patterns SD1 and SD2. The silicide layer may include metal silicide, e.g., one or more of titanium silicide, tantalum silicide, tungsten silicide, nickel silicide, and cobalt silicide.

As illustrated in FIG. 2C, the device isolation layer ST may be provided on the substrate 100 and the sidewalls of the first and second active patterns AP1 and AP2, with the gate electrodes GE thereon. At least one gate contact GC may penetrate the second interlayer dielectric layer 120 and the gate capping pattern GP to, e.g., directly, contact the gate electrode GE to make an electrical connection therewith. The gate contact GC may include the same metallic material as that of the active contact AC.

According to some example embodiments, the first amorphous region AR1 may be provided below the first source/drain pattern SD1. Because the amorphous semiconductor material of the first amorphous region AR1 has an irregular lattice structure, the first amorphous region AR1 suppresses diffusion of dopants (impurities). Therefore, the first amorphous region AR1 prevents diffusion of first conductive type impurities (e.g., phosphorus (P)) from the first source/drain pattern SD1 to the first active pattern AP1. Accordingly, it may be possible to prevent or substantially minimize current leakage from the first source/drain pattern SD1 toward the first active pattern AP1 and also to improve electrical characteristics of the semiconductor device.

According to some example embodiments, the second amorphous region AR2 may have a same structure as the first amorphous region AR1, i.e., provided below the second source/drain pattern SD2. Therefore, like the first amorphous region AR1, the second amorphous region AR2 may prevent or substantially minimize current leakage from the second source/drain pattern SD2 toward the second active pattern AP2.

FIGS. 3, 5, 7, 9, 11, and 13 illustrate plan views of stages in a method of fabricating a semiconductor device according to some example embodiments. FIGS. 4, 6A, 8A, 10A, 12A, and 14A illustrate cross-sectional views taken along line A-A' of FIGS. 3, 5, 7, 9, 11, and 13, respectively. FIGS. 6B, 8B, 10B, 12B, and 14B illustrate cross-sectional views taken along line B-B' of FIGS. 5, 7, 9, 11, and 13, respectively. FIGS. 6C, 8C, 10C, 12C, and 14C illustrate cross-sectional views taken along line C-C' of FIGS. 5, 7, 9, 11, and 13, respectively. FIGS. 6D, 8D, 10D, 12D, and 14D illustrate cross-sectional views taken along line D-D' of FIGS. 5, 7, 9, 11, and 13, respectively.

Figure 3:
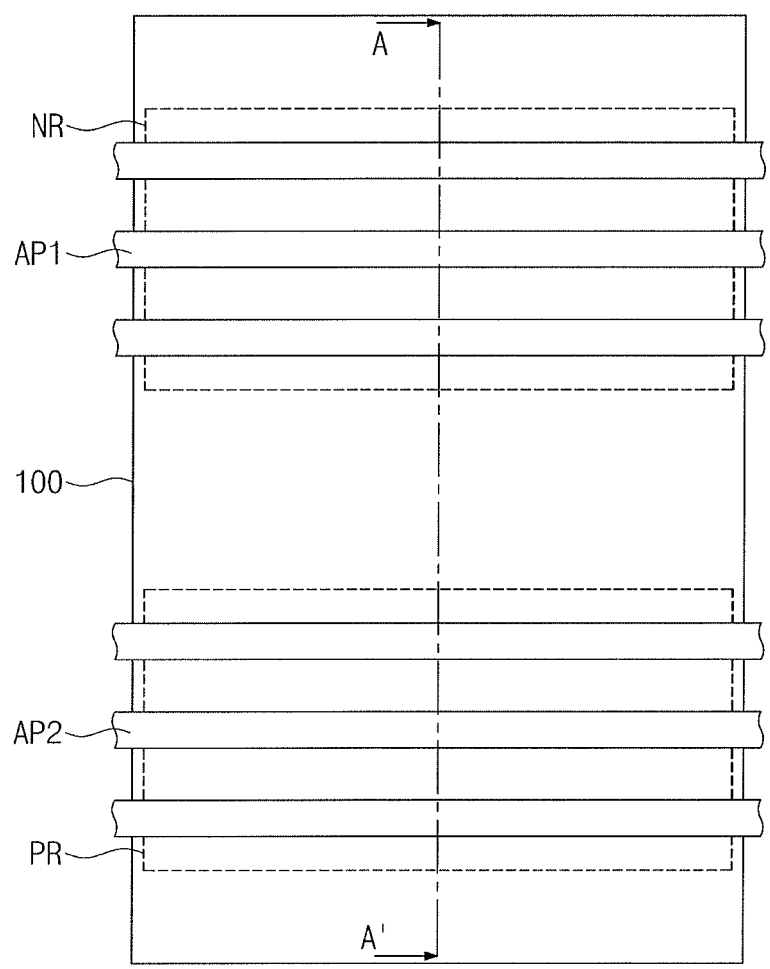
FIGS. 3, 5, 7, 9, 11, and 13 illustrate plan views of stages in a method of fabricating a semiconductor device according to some example embodiments.
Figure 4:
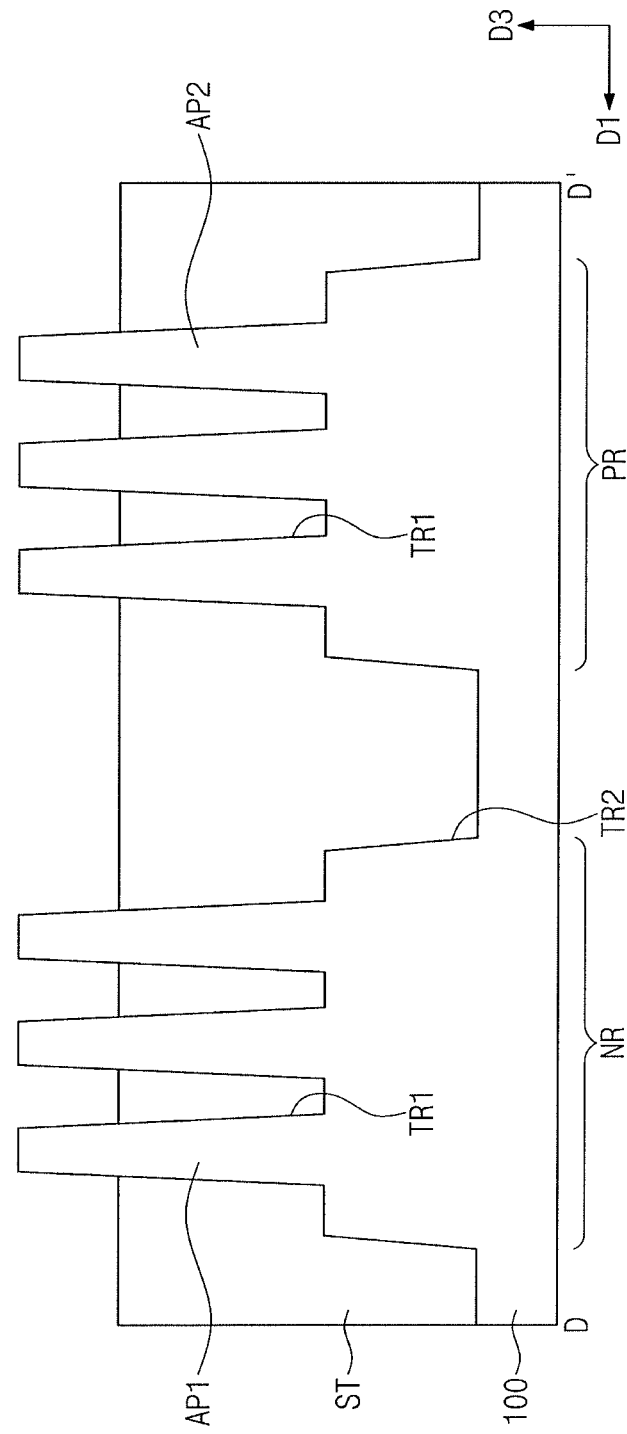
FIGS. 4, 6A, 8A, 10A, 12A, and 14A illustrate cross-sectional views taken along line A-A' of FIGS. 3, 5, 7, 9, 11, and 13, respectively.
Figure 5:
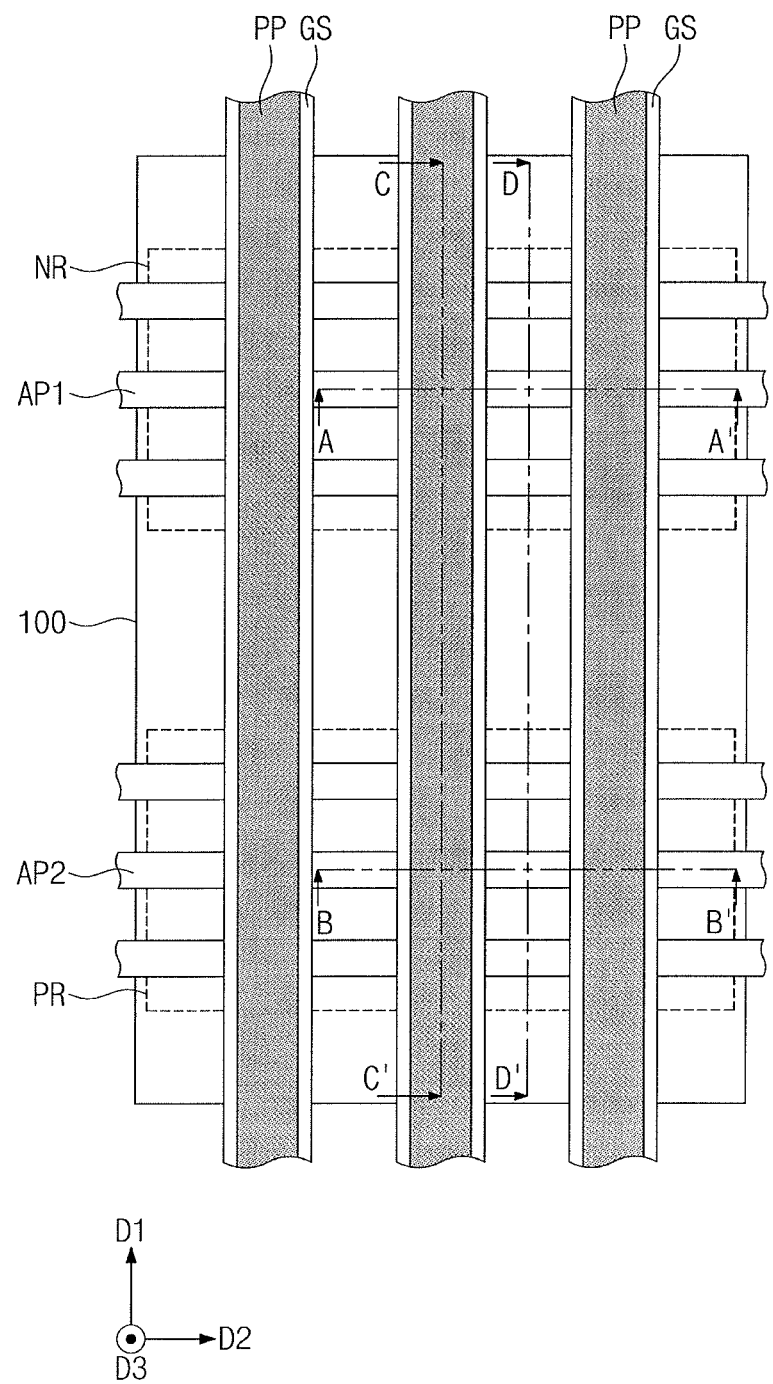
Figure 6A:
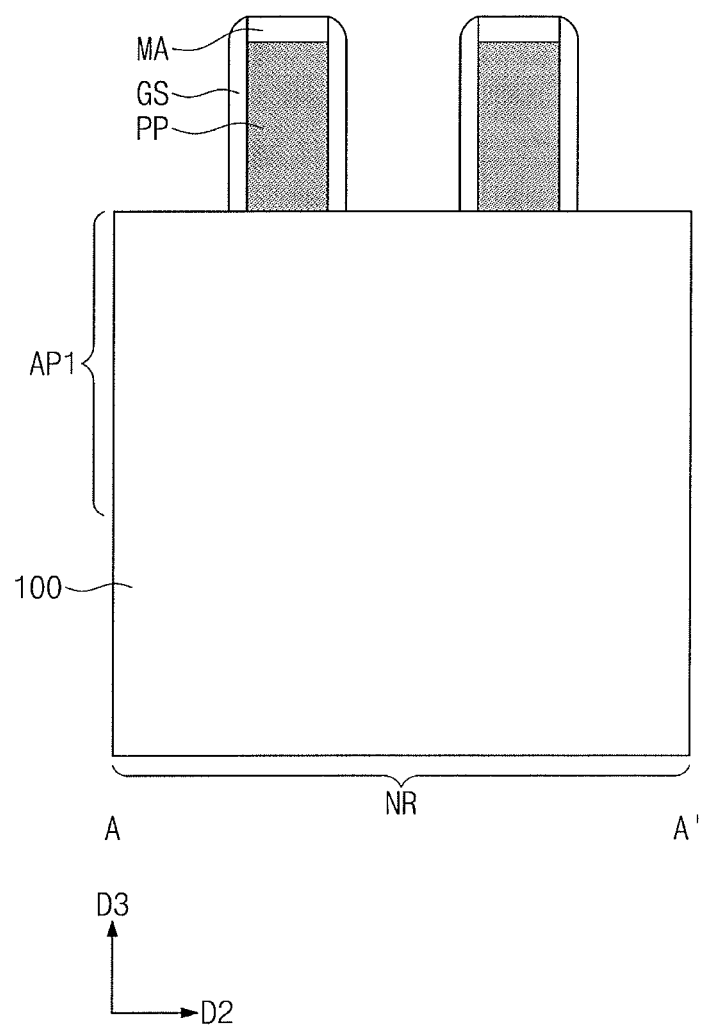
Figure 6B:
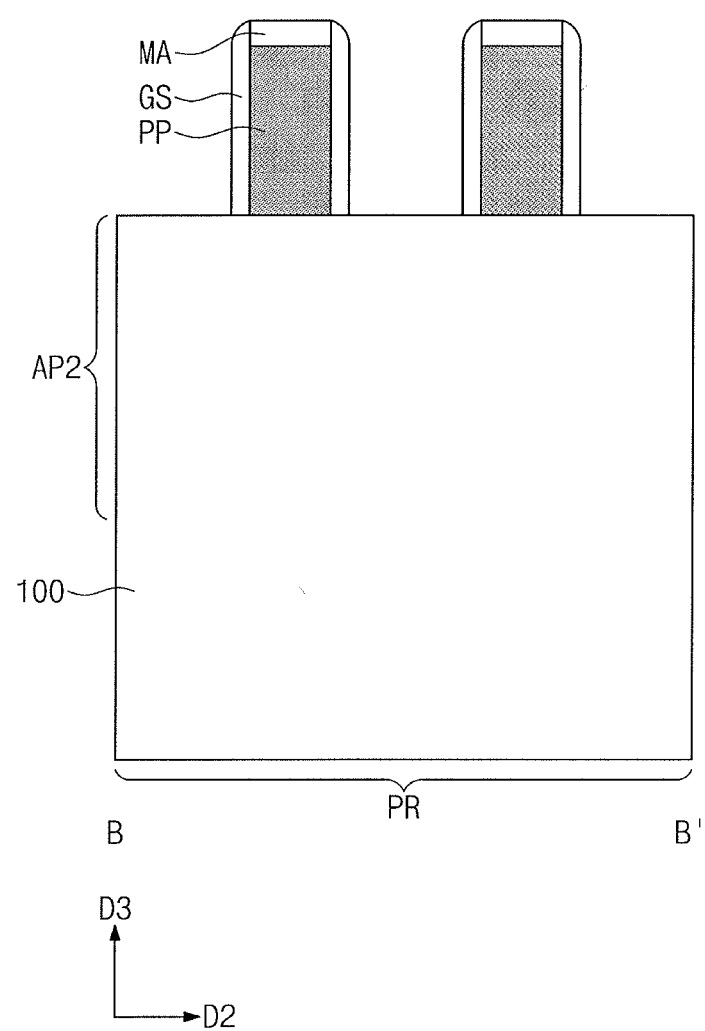
FIGS. 6B, 8B, 10B, 12B, and 14B illustrate cross-sectional views taken along line B-B' of FIGS. 5, 7, 9, 11, and 13, respectively.
Figure 6C:
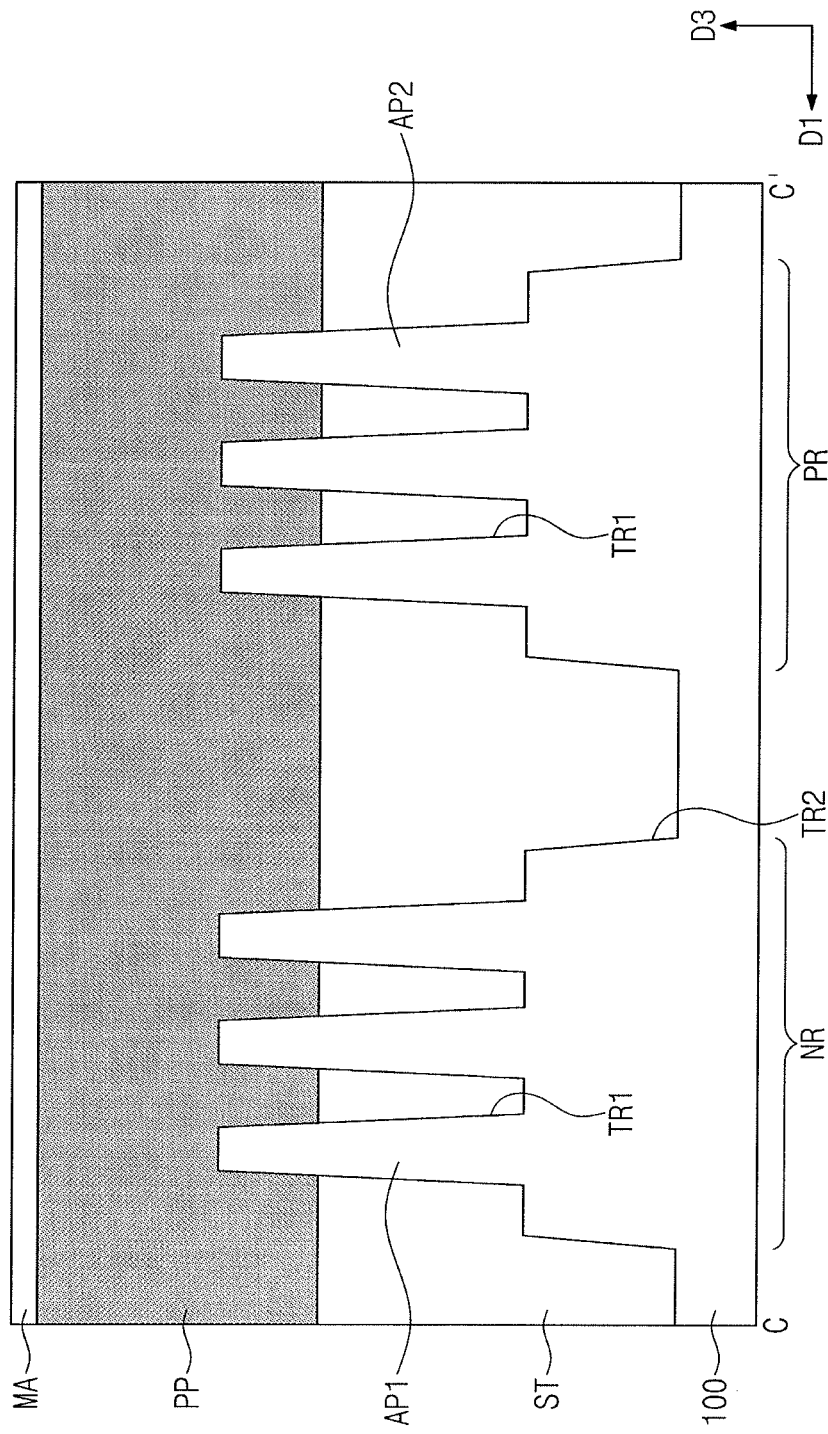
Figure 6D:
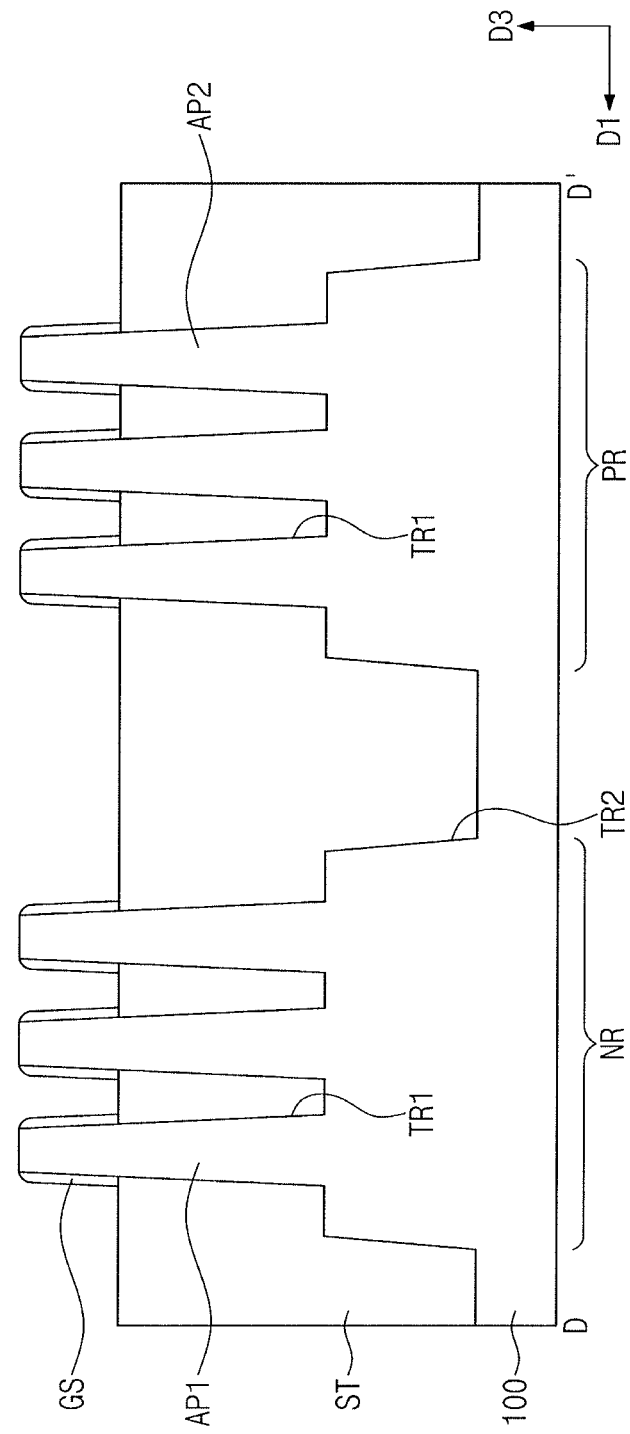
FIGS. 6D, 8D, 10D, 12D, and 14D illustrate cross-sectional views taken along line D-D' of FIGS. 5, 7, 9, 11, and 13, respectively.

Referring to FIGS. 3 and 4, the substrate 100 may be provided with the first active region NR and the second active region PR. The substrate 100 may be patterned to form the first active patterns AP1 and the second active patterns AP2. The first active patterns AP1 may be formed on the first active region NR, and the second active patterns AP2 may be formed on the second active region PR. The first trench TR1 may be formed between adjacent ones of the first active patterns AP1 and between adjacent ones of the second active patterns AP2.

The substrate 100 may be patterned to form the second trench TR2 between the first active region NR and the second active region PR. The second trench TR2 may be formed deeper than the first trench TR1.

The device isolation layer ST may be formed on the substrate 100, filling the first and second trenches TR1 and TR2. The device isolation layer ST may include a dielectric material, e.g., a silicon oxide layer. The device isolation layer ST may be recessed until upper portions of the first and second active patterns AP1 and AP2 are exposed. Thus, the upper portions of the first and second active patterns AP1 and AP2 may vertically protrude beyond, e.g., above, the device isolation layer ST.

Referring to FIGS. 5 and 6A to 6D, sacrificial patterns PP may be formed to extend along the first direction D1 and intersect the first and second active patterns AP1 and AP2. The sacrificial patterns PP may be formed to have a linear or bar shape extending in the first direction D1. For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer into the sacrificial patterns PP. The sacrificial layer may include, e.g., a polysilicon layer.

A pair of gate spacers GS may be formed on opposite sidewalls of each of the sacrificial patterns PP. The gate spacers GS may also be formed on opposite sidewalls of each of the first and second active patterns AP1 and AP2. The opposite sidewalls of each of the first and second active patterns AP1 and AP2 may be exposed portions that are not covered with the device isolation layer ST and the sacrificial patterns PP.

The formation of the gate spacers GS may include conformally forming a gate spacer layer on the entire surface of the substrate 100 and anisotropically etching the gate spacer layer. The gate spacer layer may include one or more of, e.g., SiCN, SiCON, and SiN. Alternatively, the gate spacer layer may be a multi-layer including two or more of, e.g., SiCN, SiCON, and SiN.

Referring to FIGS. 7 and 8A to 8D, a first mask pattern MP1 may be selectively formed on the second active region PR. The first mask pattern MP1 may expose the first active region NR.

Figure 7:
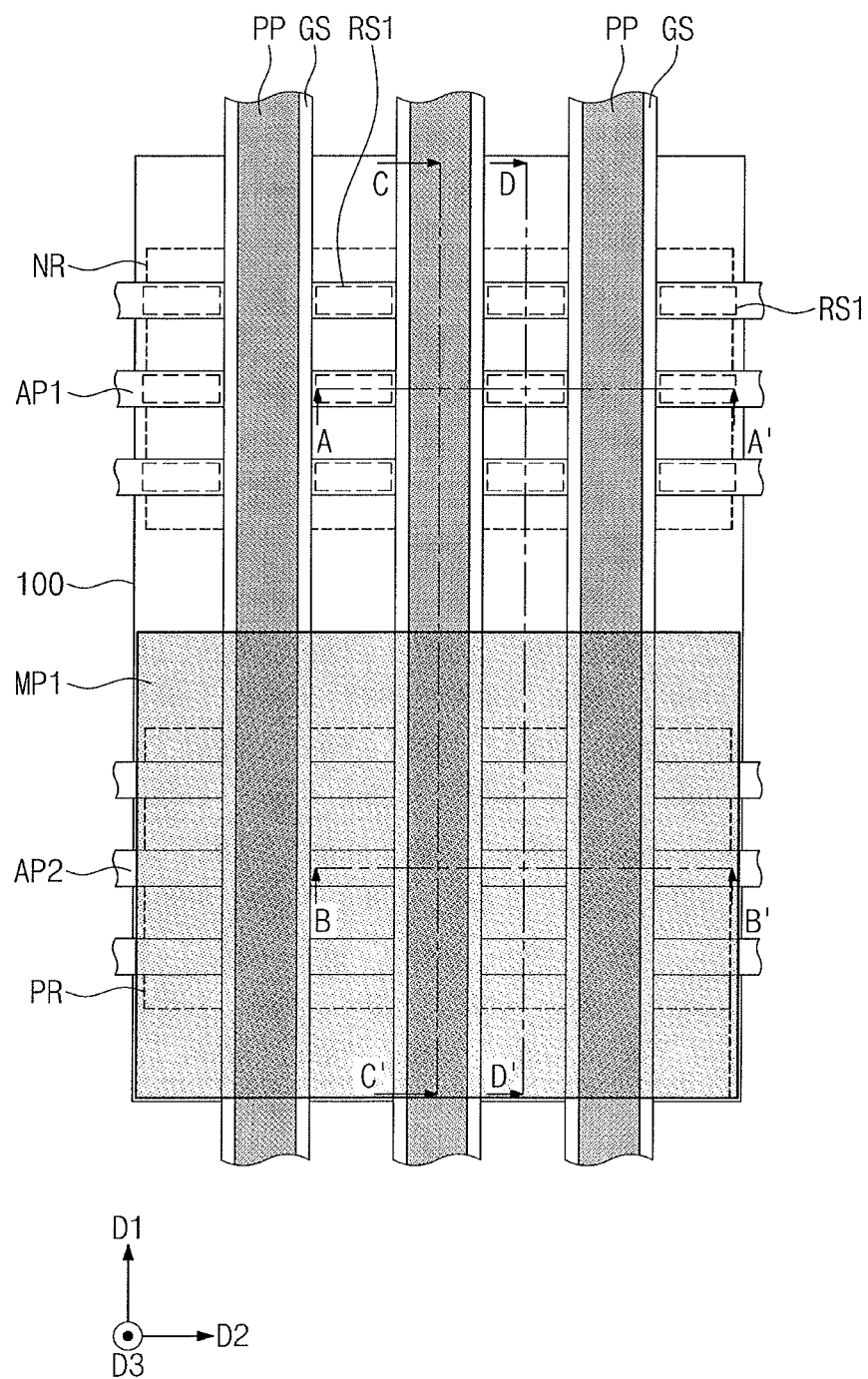
Figure 8A:
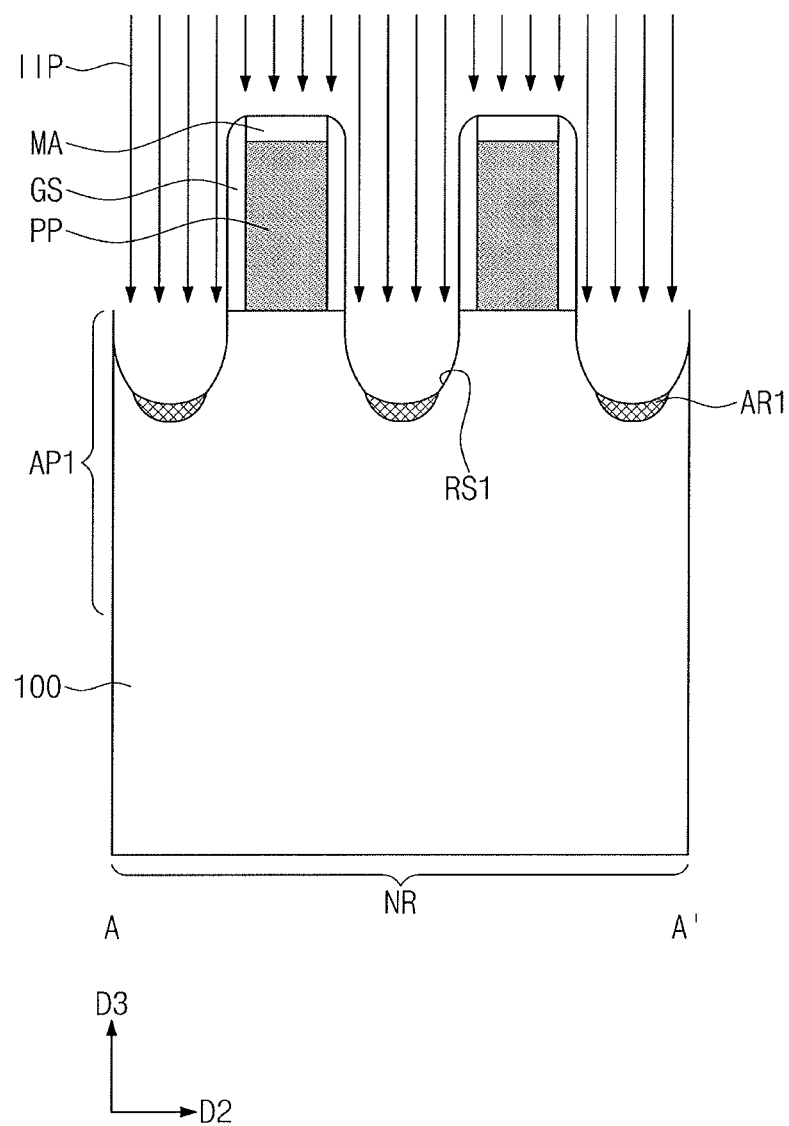
Figure 8B:
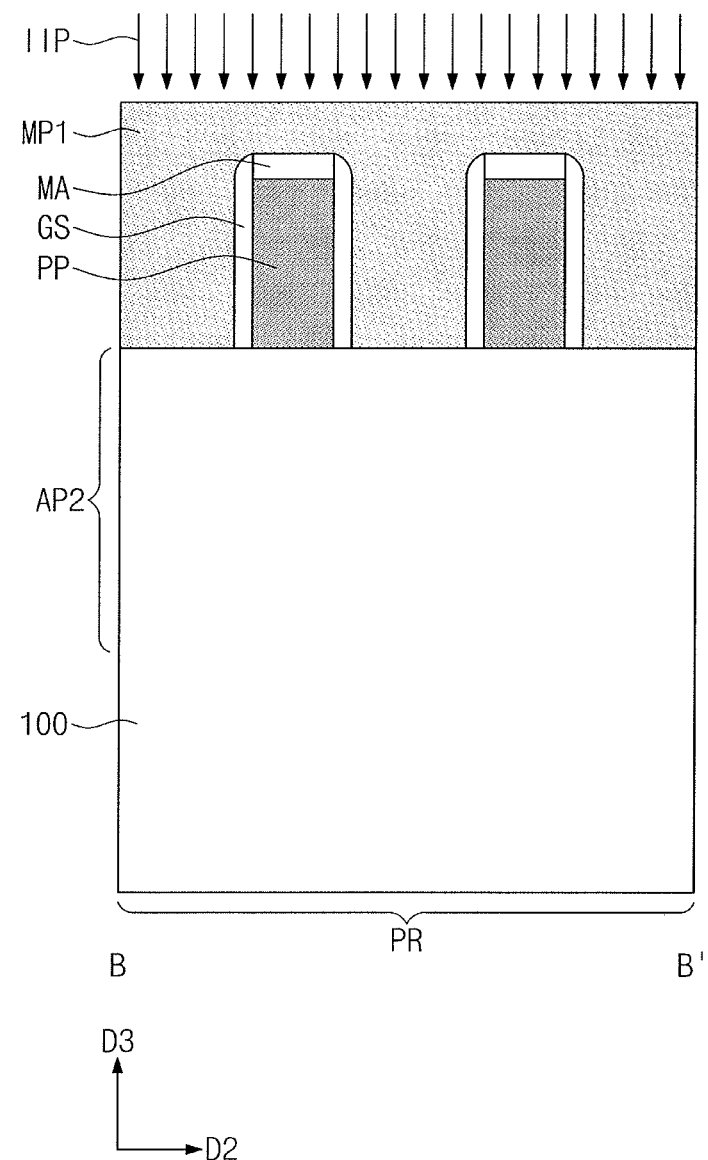
Figure 8D:
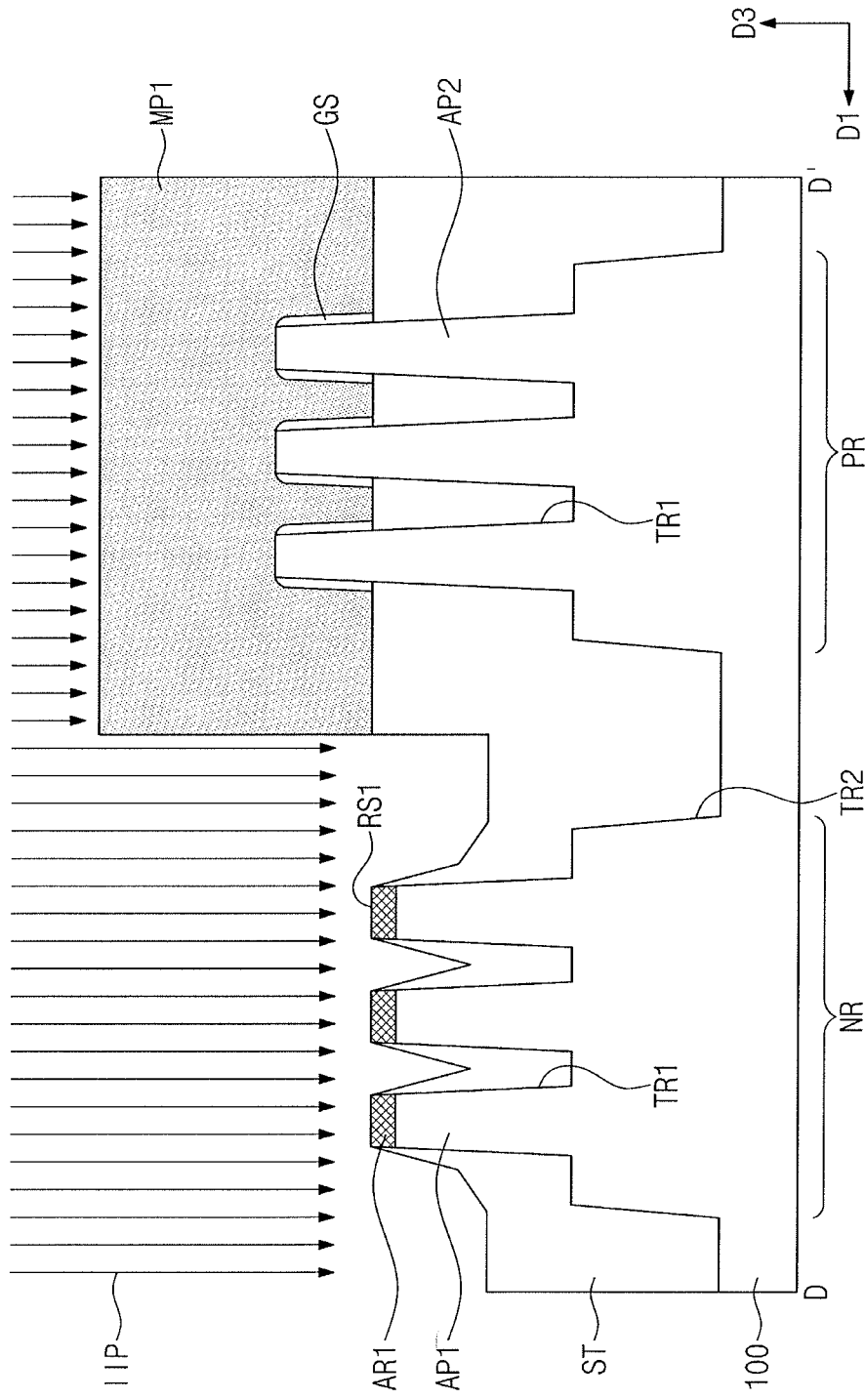
Figure 9:
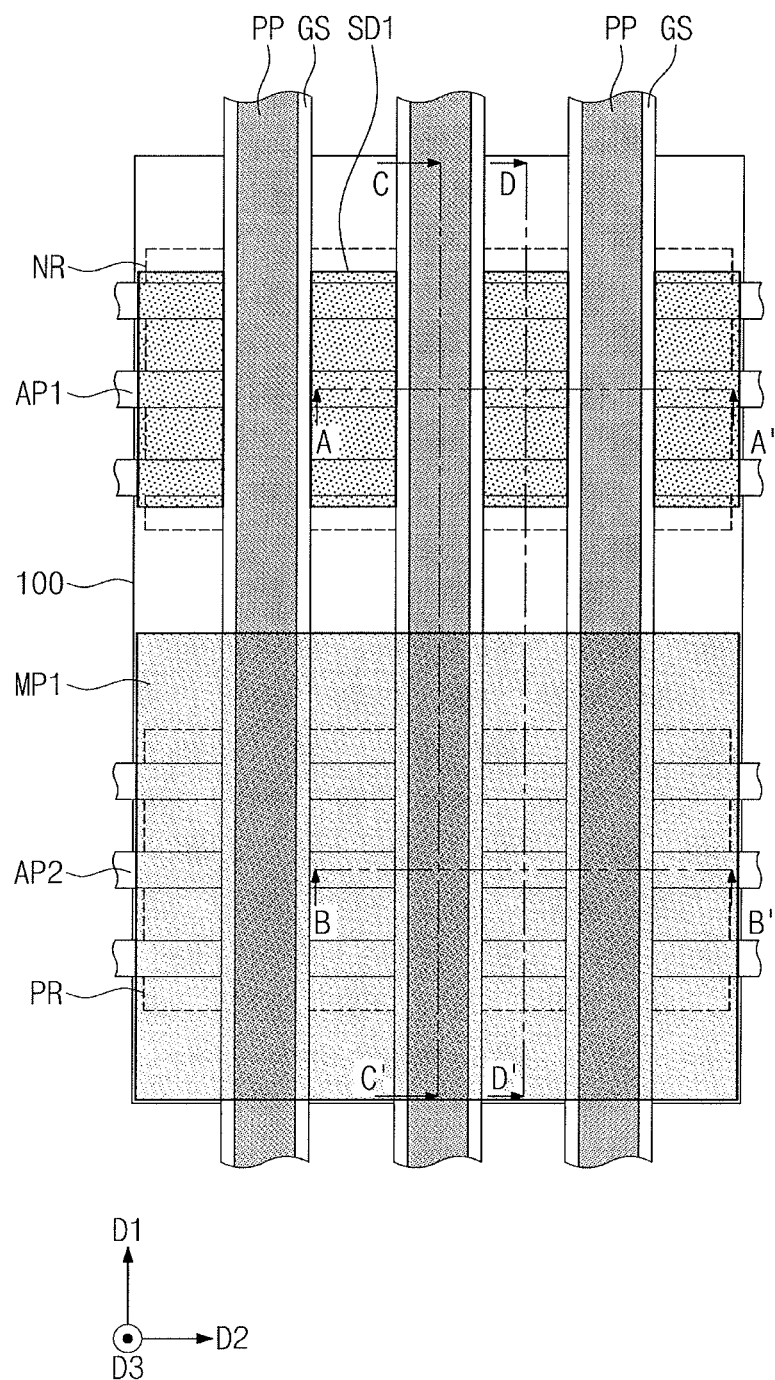
Figure 10A:
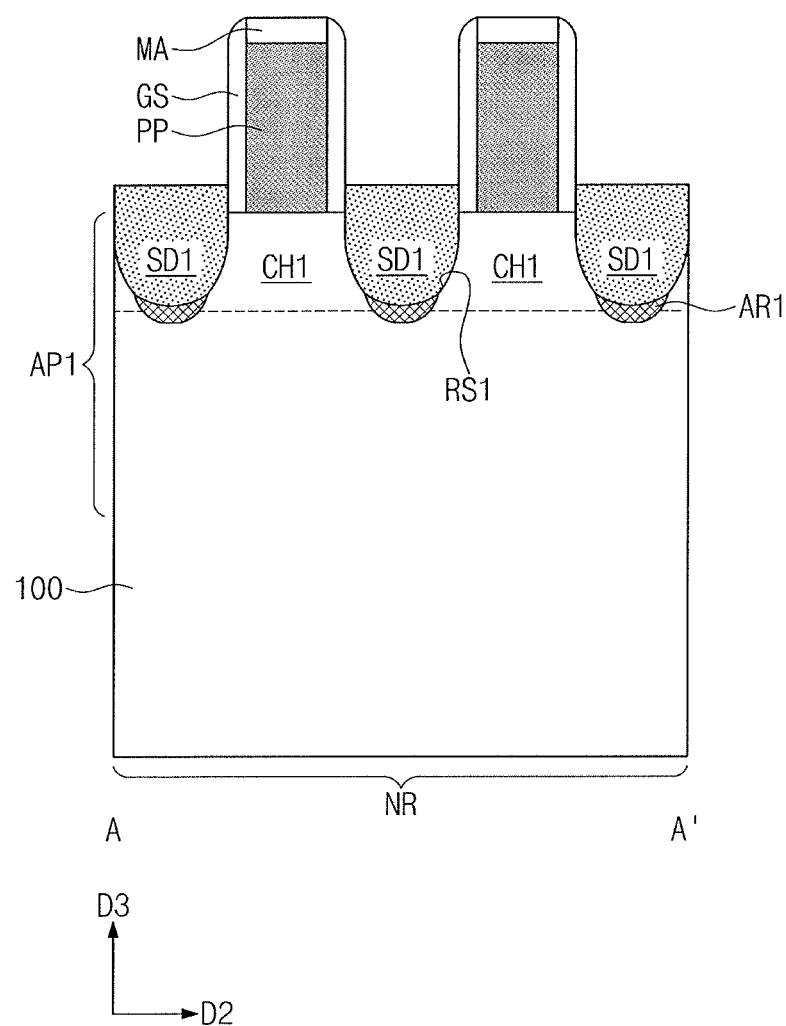
Figure 10B:
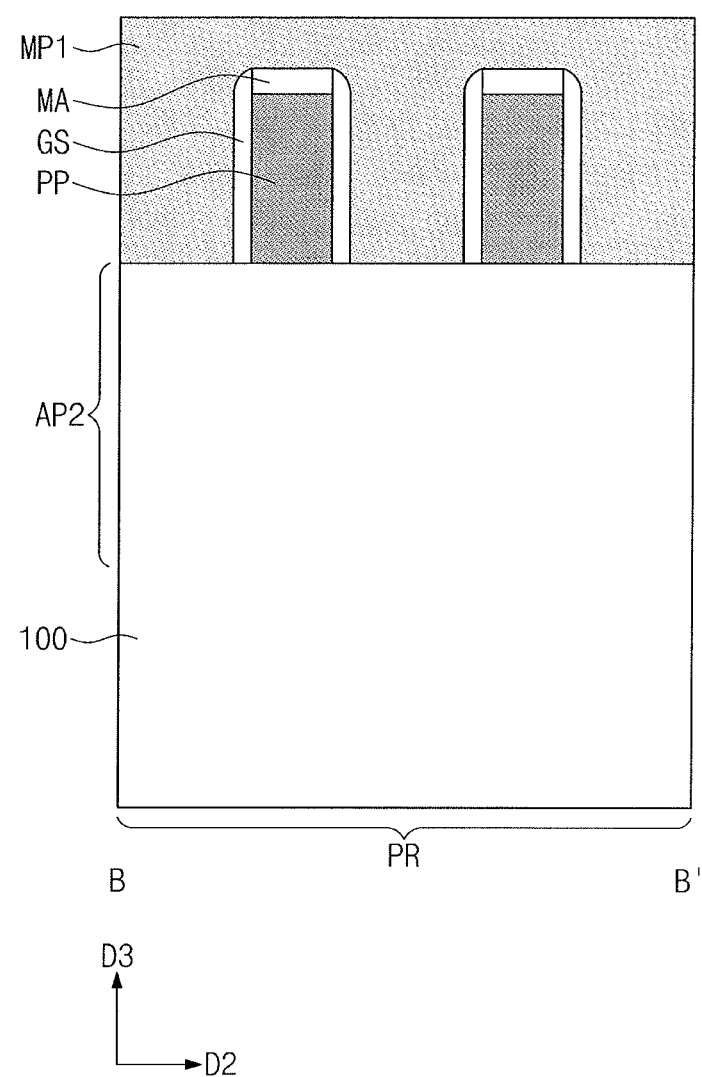
Figure 10C:
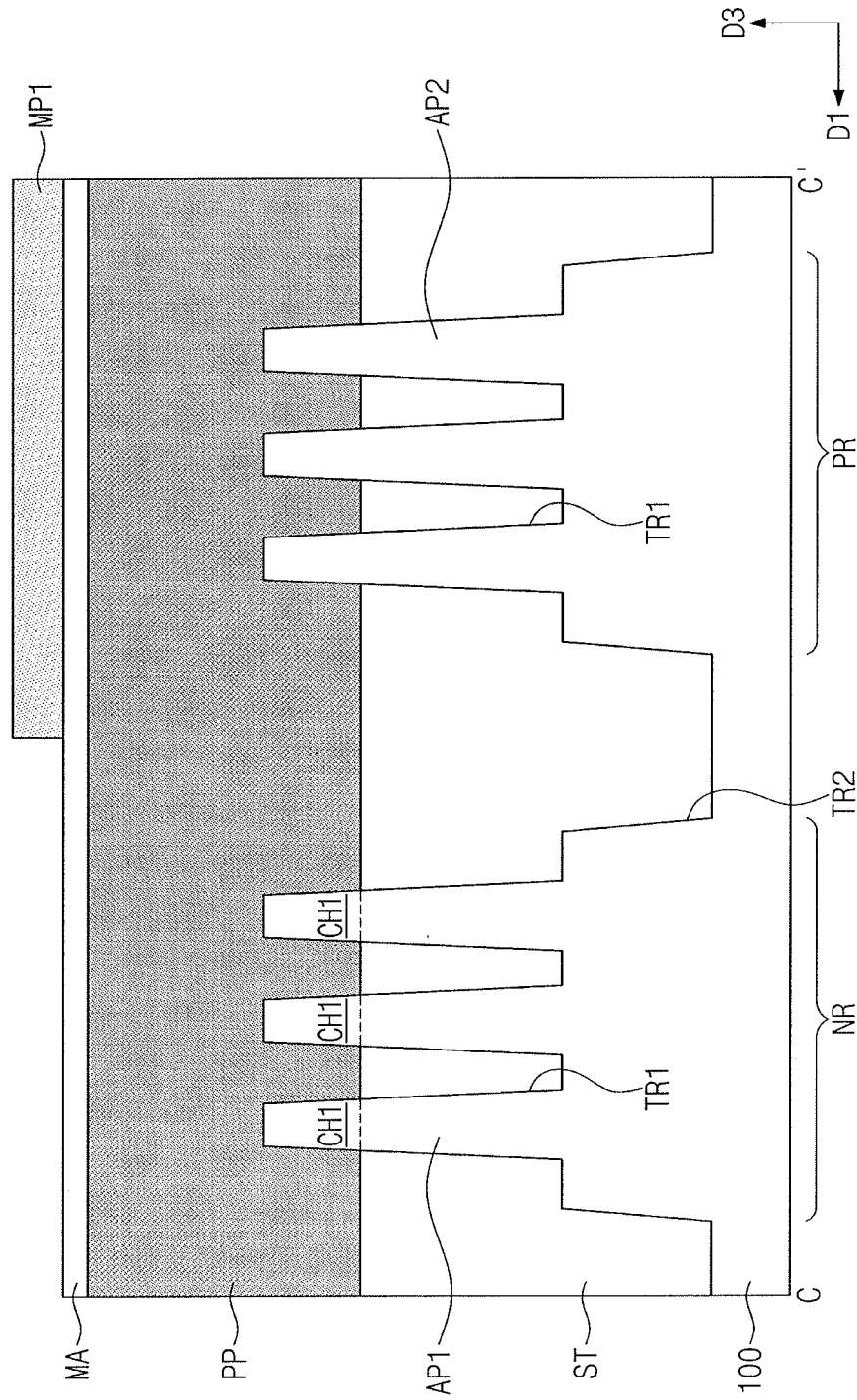
Figure 10D:
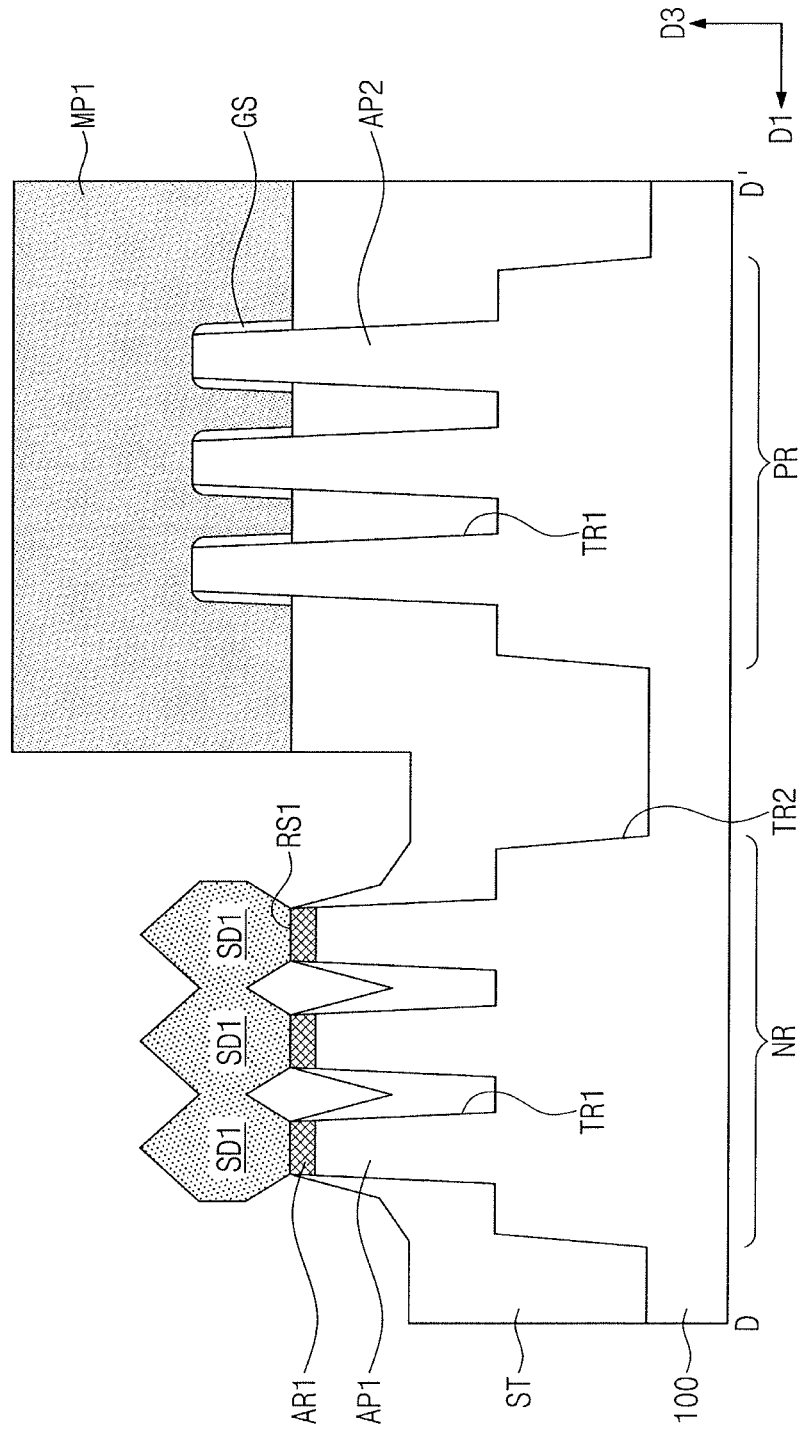
Figure 11:
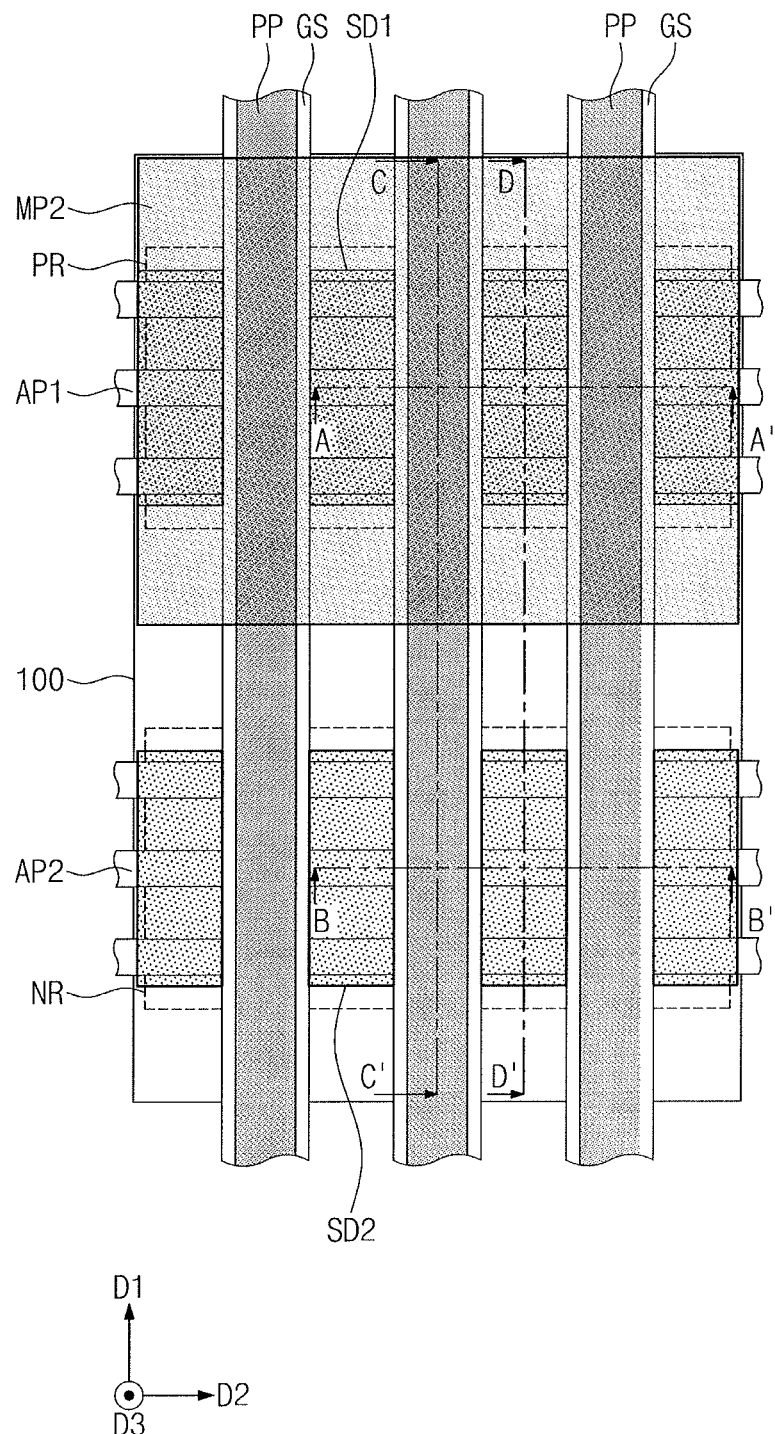
Figure 12A:
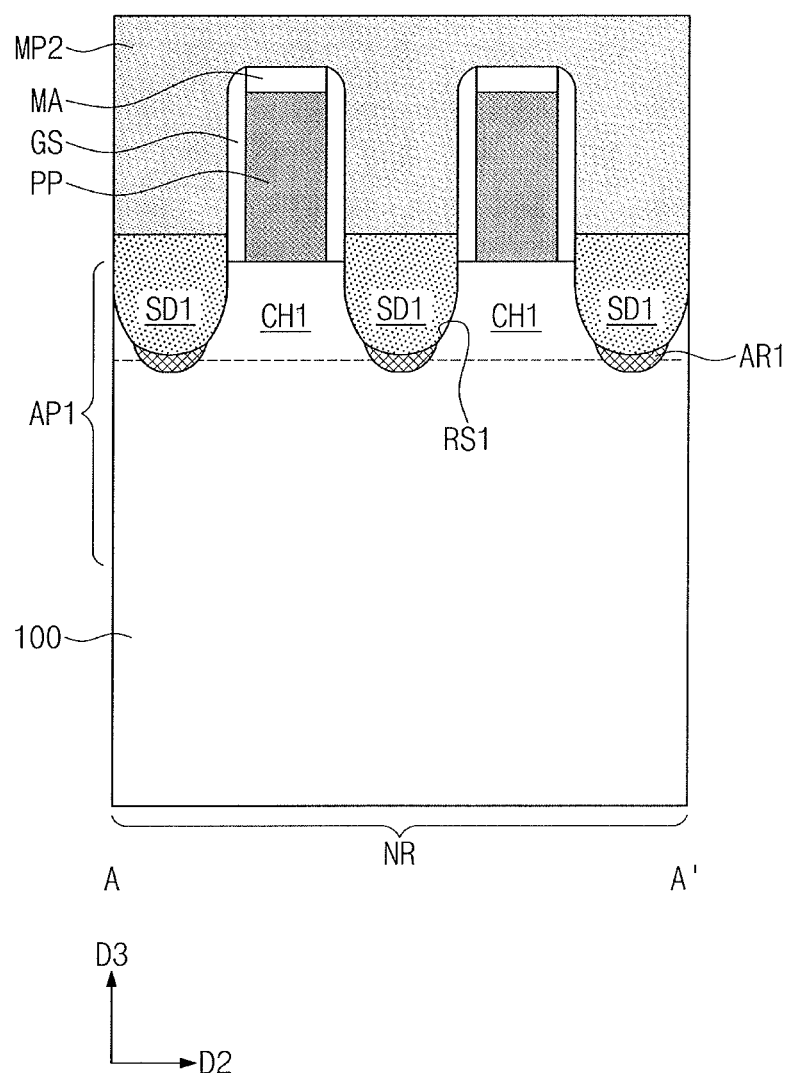
Figure 12B:
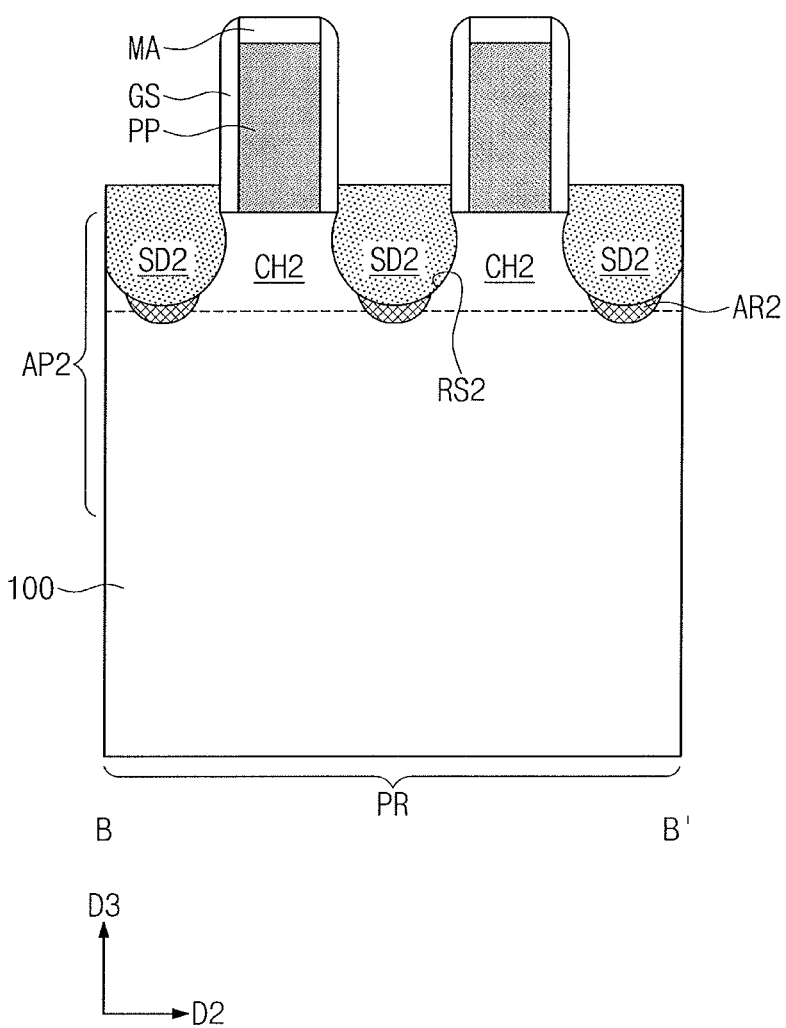
Figure 12C:
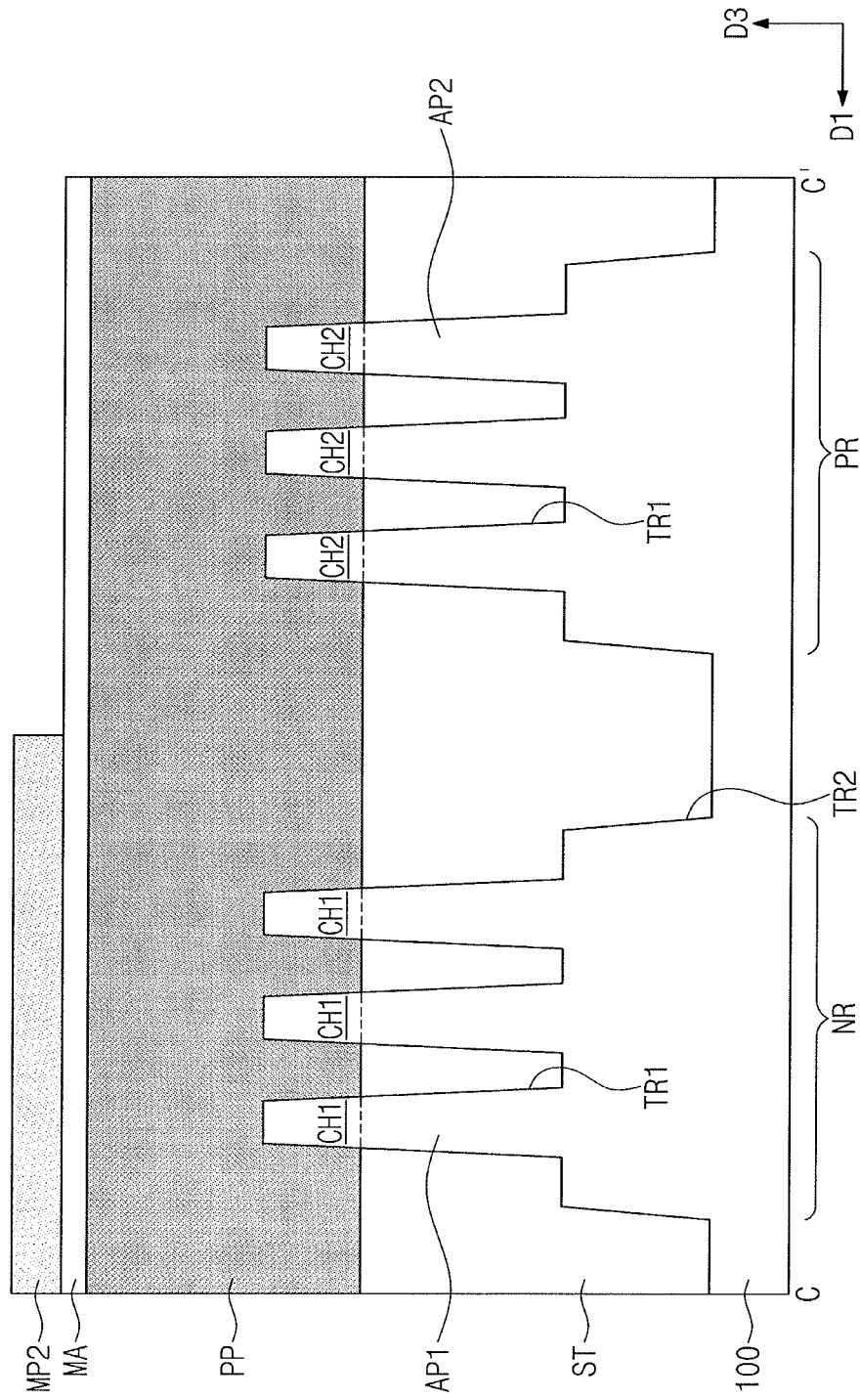
Figure 12D:
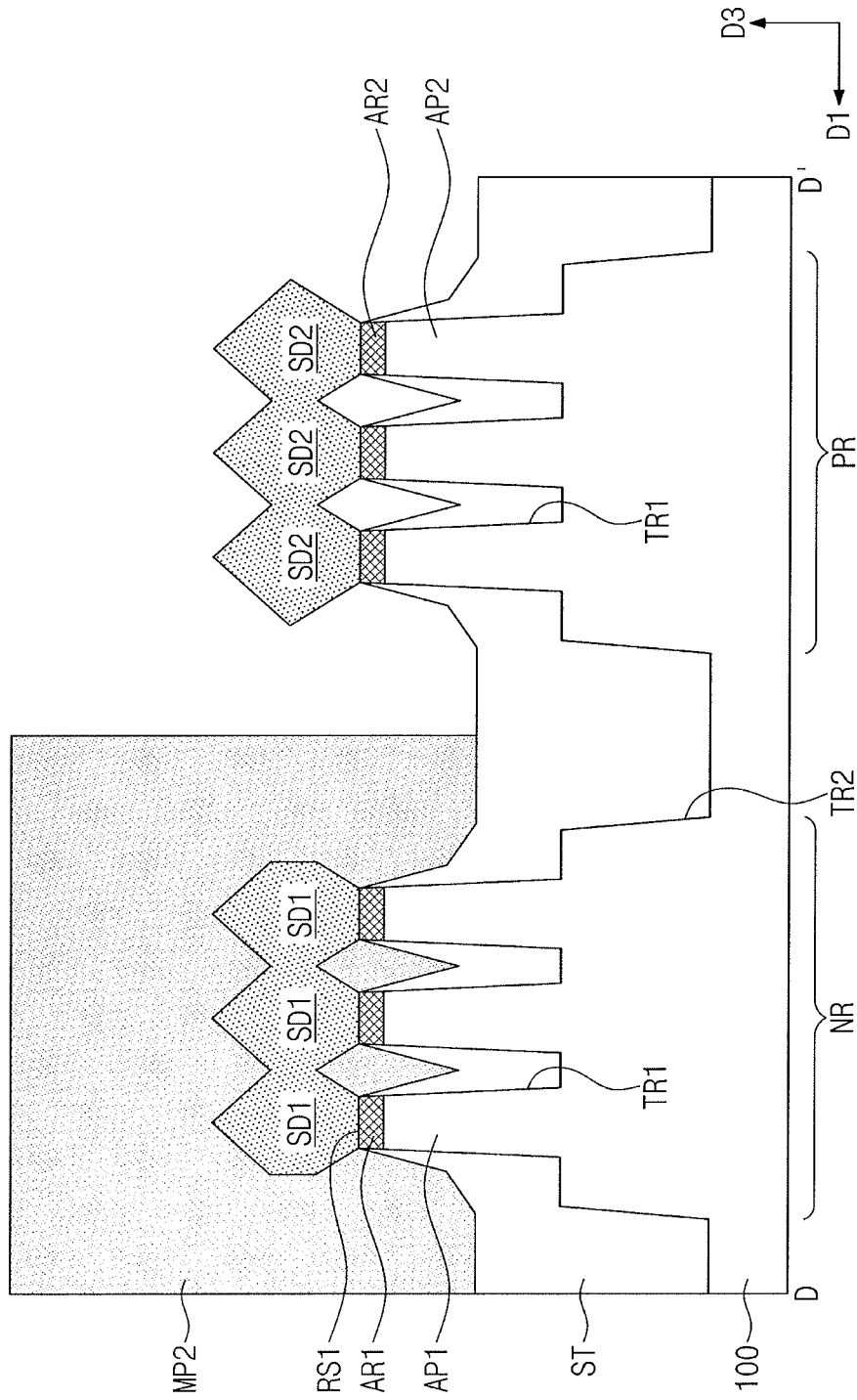
Figure 13:
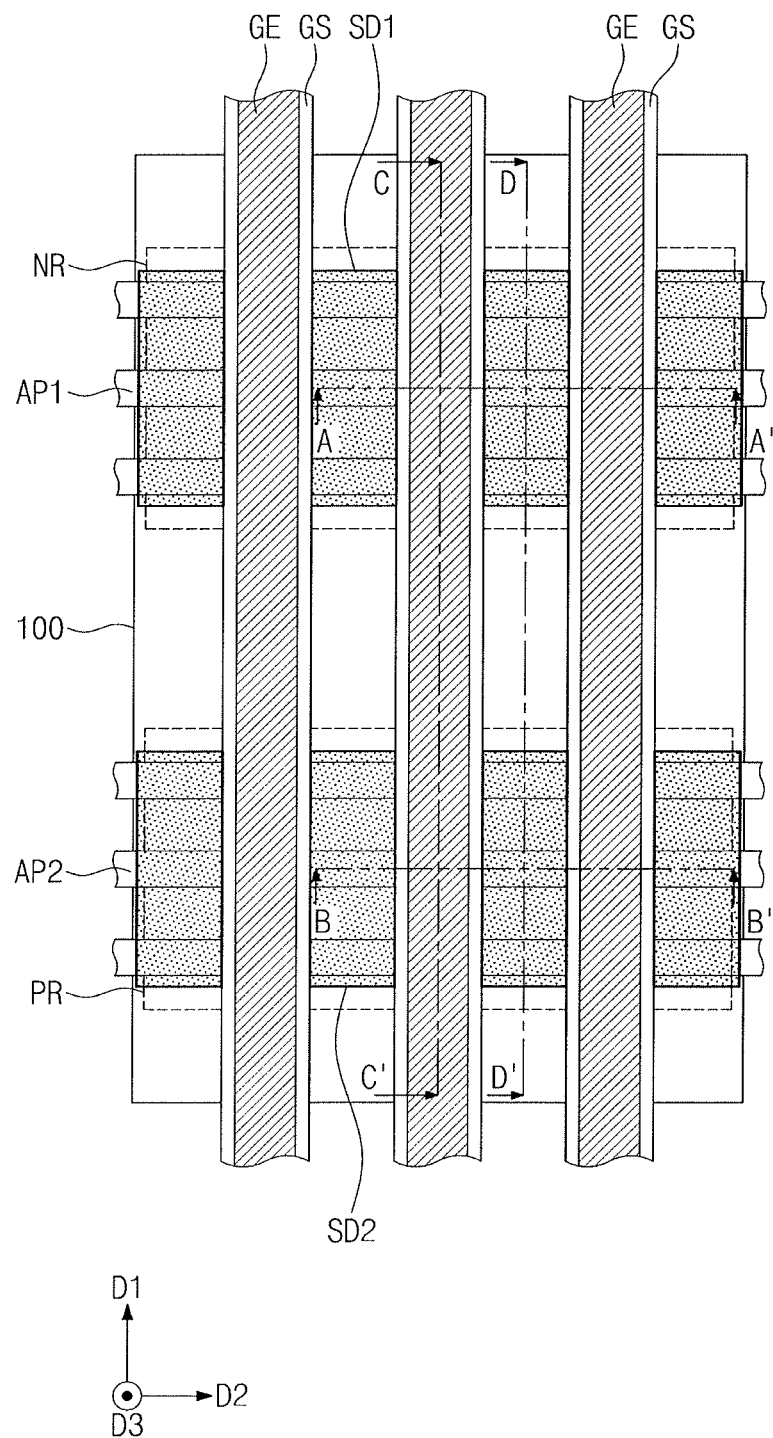
Figure 14A:
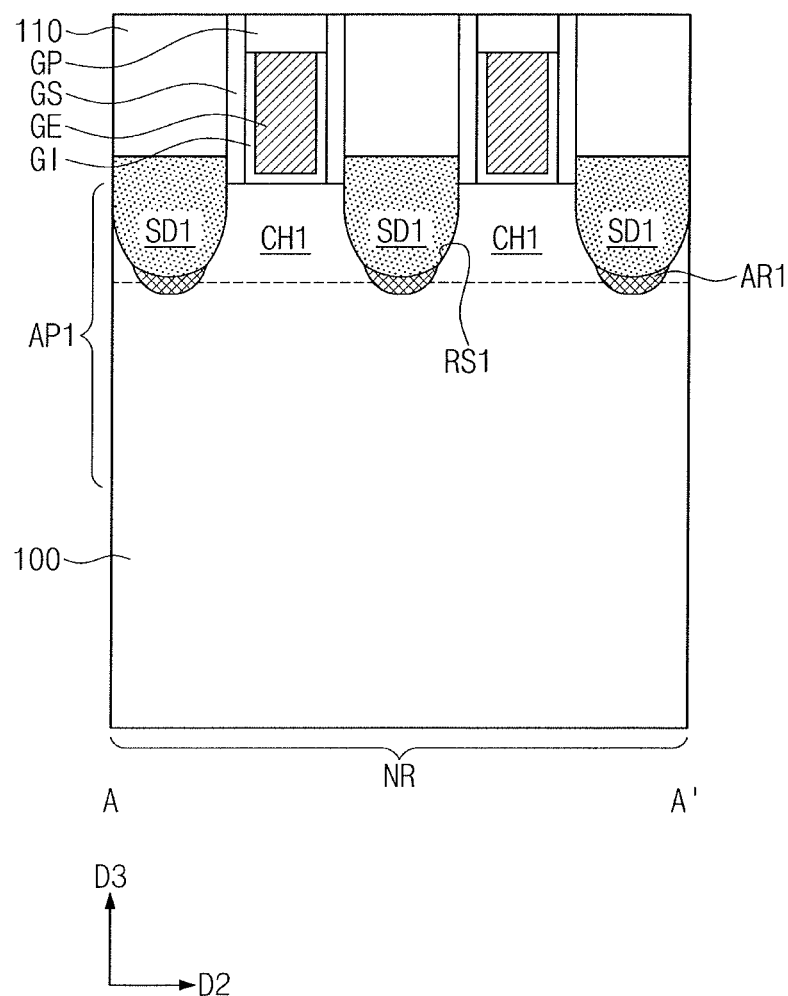
Figure 14B:
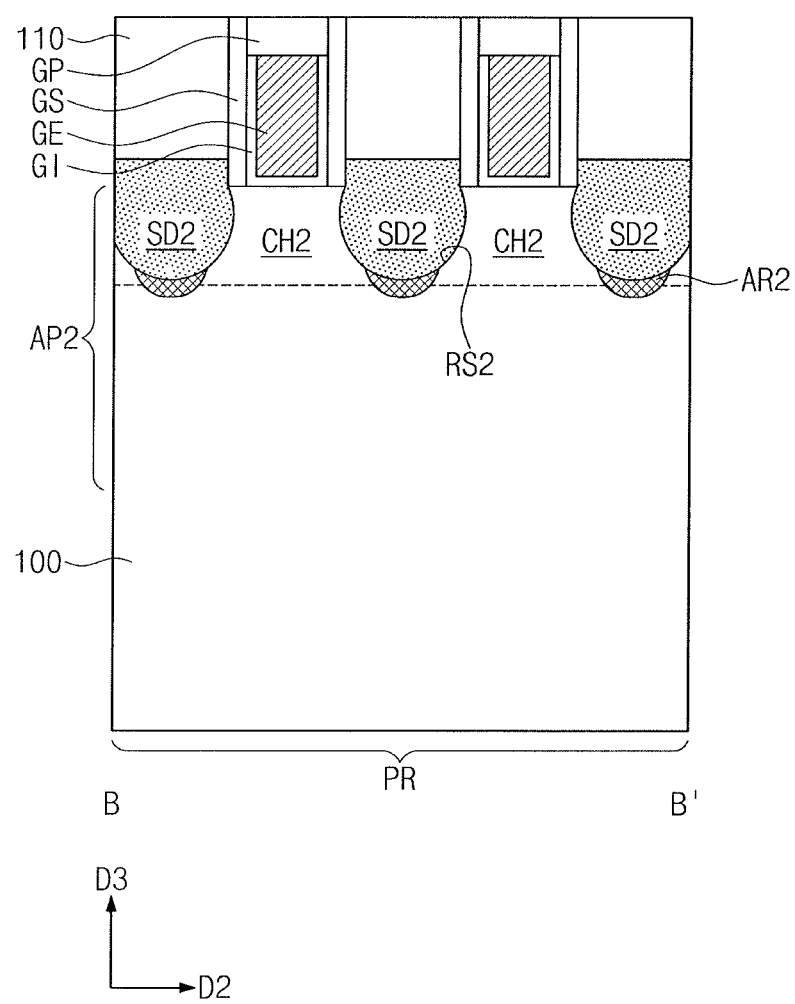
Figure 14C:
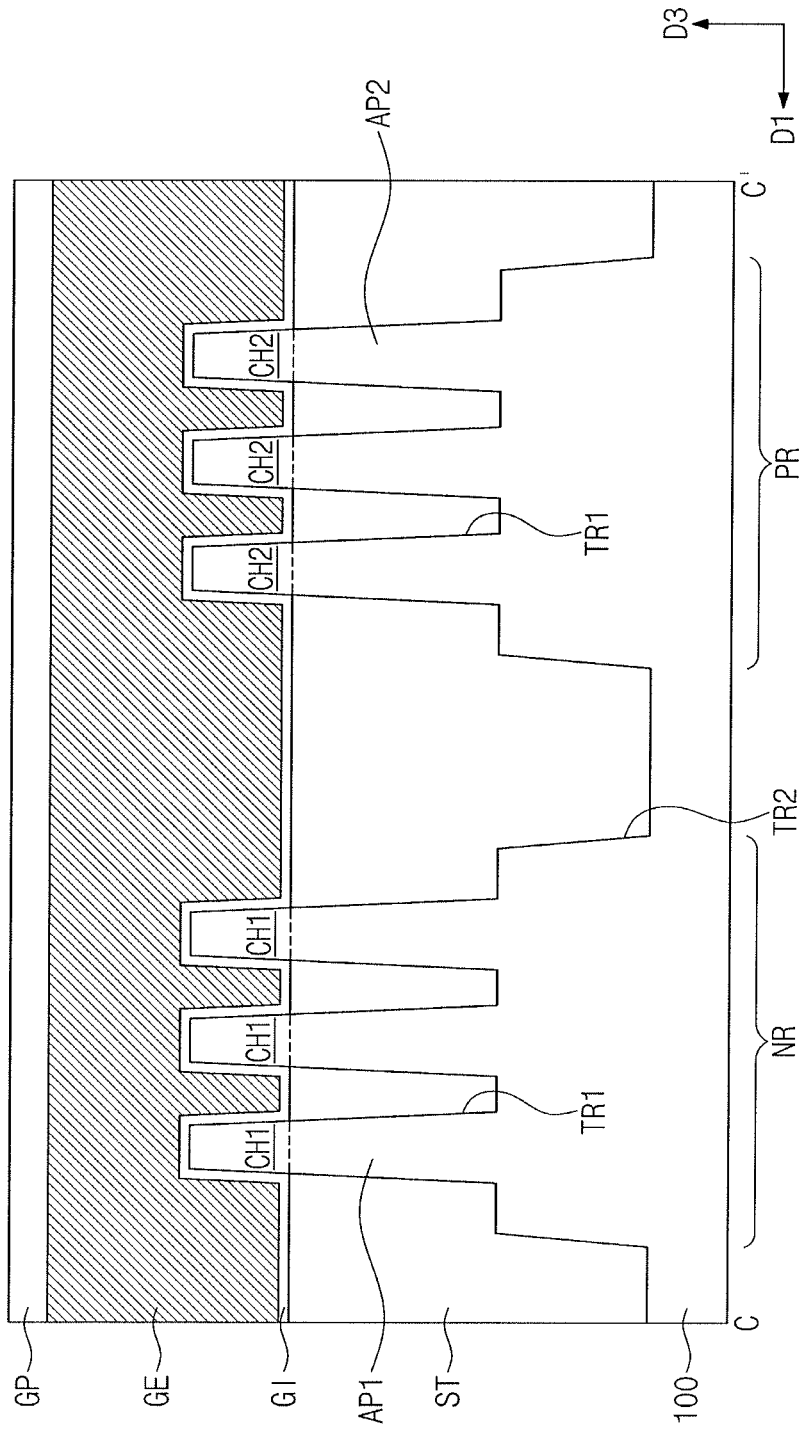
Figure 14D:
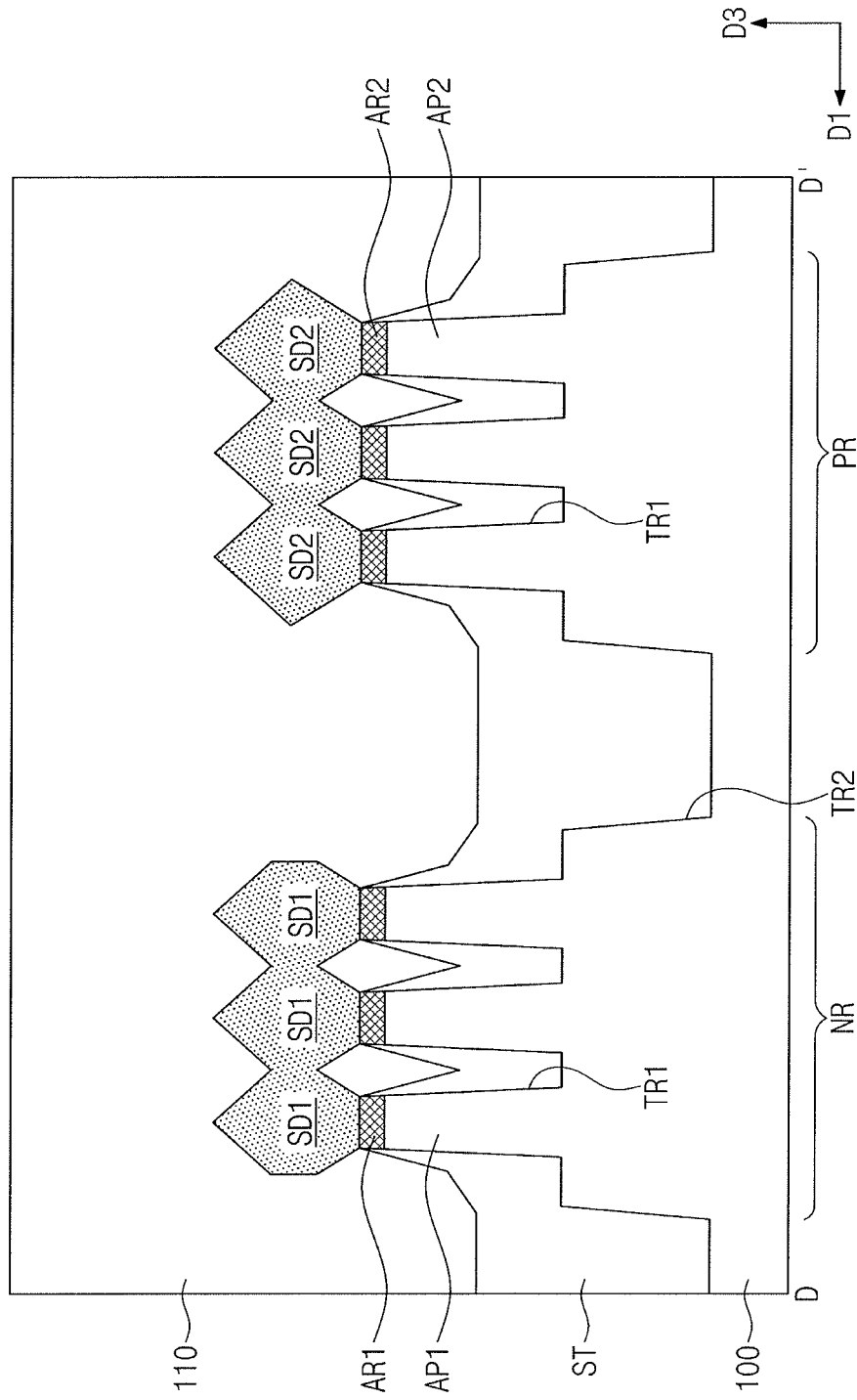

An etching process may be performed in which the first mask pattern MP1 is used as an etching mask through which the upper portions of the first active patterns AP1 may be etched to form the first recesses RS1, as illustrated in FIGS. 7 and 8A. Neither the hardmask patterns MA nor the gate spacers GS may be etched during the etching process. As a result, the first recess RS1 may be formed between a pair of adjacent sacrificial patterns PP (FIG. 8A).

When the upper portions of the first active patterns AP1 are etched, the gate spacers GS may also be removed from the opposite sidewalls of each of the first active patterns AP1. When the upper portions of the first active patterns AP1 are etched, the device isolation layer ST may be recessed between the first active patterns AP1.

An ion implantation process IIP may be performed on the entire surface of the substrate 100. The ion implantation process IIP may form the first amorphous regions AR1 below corresponding first recesses RS1. For example, the ion implantation process IIP may implant impurities through the bottoms of the first recesses RS1 into regions of the first active patterns AP1 immediately below the bottoms of the first recesses RS1 to define the first amorphous regions AR1, e.g., so tops of the first amorphous regions AR1 may define the bottoms of the corresponding first recesses RS1. For example, through the ion implantation process IIP, the first dopant may be doped, e.g., implanted, below the first recess RS1, e.g., the first dopant may be doped only through the bottom of the first recess RS1 to be at the bottom of the first recess RS1 without extending along sidewalls of the first recess RS1. The first dopant may collide with a semiconductor crystalline structure below the first recess RS1, and thus the semiconductor crystalline structure may be broken. The broken crystalline structure causes the first recess RS1 to have thereunder a semiconductor in an amorphous state.

For example, the ion implantation process IIP may include implantation of the first dopant at a dose of about $1E14/cm^2$ to about $1E16/cm^2$, at an energy of about 1 keV to about 10 keV, and at a tilt angle of about 0° to about 45°. For example, the angle of the ion implantation process IIP may be controlled to provide implantation only at the bottom of the first recess RS1. The first dopant may be, e.g., at least one of As, Ge, P, C, Si, N, and a combination thereof. For example, the first dopant may be arsenic (As).

During the ion implantation process IIP, the first mask pattern MP1 may prevent the second active region PR from being doped with the first dopant.

Referring to FIGS. 9 and 10A to 10D, the first source/drain patterns SD1 may be formed on the upper portion of each of the first active patterns AP1, e.g., to fill the first recesses RS1 and extend above the first active patterns AP1.

A pair of first source/drain patterns SD1 may be formed on opposite sides of each of the sacrificial patterns PP, respectively. The first source/drain patterns SD1 may correspondingly fill the first recesses RS1.

The first source/drain patterns SD1 may be formed by performing a selective epitaxial growth process in which inner sidewalls of the first recesses RS1 are used as seed layers. The formation of the first source/drain patterns SD1 may define the first channel pattern CH1 between a pair of first source/drain patterns SD1. For example, the selective epitaxial growth process may include a chemical vapor deposition (CVD) process or a molecular beam epitaxy (MBE) process. For example, the first source/drain patterns SD1 may include the same semiconductor element (e.g., Si) as that of the substrate 100.

In certain embodiments, impurities may be in-situ implanted during the selective epitaxial growth process for forming the first source/drain patterns SD1. In other embodiments, after the first source/drain patterns SD1 are formed, impurities may be implanted into the first source/drain patterns SD1. The first source/drain patterns SD1 may be doped with impurities to have a first conductive type (e.g., n-type).

Referring to FIGS. 11 and 12A to 12D, the first mask pattern MP1 may be removed. A second mask pattern MP2 may be selectively formed on the first active region NR. The second mask pattern MP2 may expose the second active region PR.

The second mask pattern MP2 may be used as an etching mask through which the upper portions of the second active patterns AP2 may be etched to form the second recesses RS2, e.g., in a substantially same way as the first recesses RS1. The entire surface of the substrate 100 may undergo an ion implantation process to form the second amorphous regions AR2 below corresponding second recesses RS2, e.g., in a substantially same way as the first amorphous regions AR1. Through the ion implantation process, the second dopant may be doped below the second recess RS2. The second dopant may be, e.g., at least one of Ge, C, N, and a combination thereof.

The second source/drain patterns SD2 may be formed on the upper portion of each of the second active patterns AP2. The second source/drain patterns SD2 may be formed by performing a selective epitaxial growth process in which inner sidewalls of the second recesses RS2 are used as seed layers. The formation of the second source/drain patterns SD2 may define the second channel pattern CH2 between a pair of second source/drain patterns SD2. For example, the second source/drain patterns SD2 may include a semiconductor element (e.g., SiGe) having a lattice constant that is greater than that of a semiconductor element of the substrate 100. The second source/drain patterns SD2 may be doped with impurities to have a second conductive type (e.g., p-type).

Referring to FIGS. 13 and 14A to 14D, the first interlayer dielectric layer 110 may be formed to cover the first and second source/drain patterns SD1 and SD2, the hardmask patterns MA, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be used to planarize the first interlayer dielectric layer 110. The hardmask patterns MA may all be removed during the planarization process. As a result, the first interlayer dielectric layer 110 may have a top surface substantially coplanar with those of the sacrificial patterns PP and those of the gate spacers GS.

The sacrificial patterns PP may be replaced with gate electrodes GE. For example, the exposed sacrificial patterns PP may be selectively removed. The removal of the sacrificial patterns PP may form empty spaces. The gate dielectric layer GI, the gate electrode GE, and the gate capping pattern GP may be formed in each of the empty spaces.

Referring back to FIGS. 1 and 2A to 2D, the second interlayer dielectric layer 120 may be formed on the first interlayer dielectric layer 110. The active contacts AC may be formed to penetrate the second and first interlayer dielectric layers 120 and 110 and to have an electrical connection with the first and second source/drain patterns SD1 and SD2. The gate contact GC may be formed to penetrate the second interlayer dielectric layer 120 and the gate capping pattern GP and to have electrical connection with the gate electrode GE.

Figure 15:
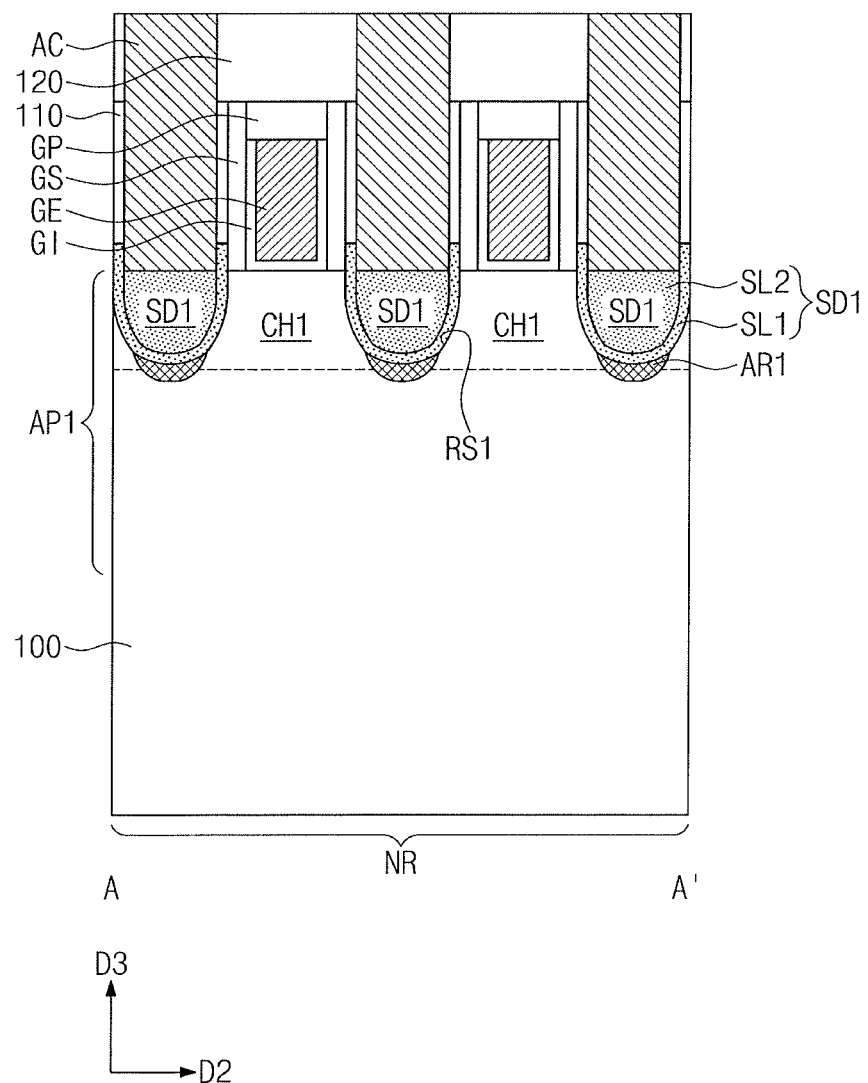
FIG. 15 illustrates a cross-sectional view corresponding to line A-A' of FIG. 1 of a semiconductor device according to some example embodiments.

FIG. 15 illustrates a cross-sectional view taken along line A-A' of FIG. 1, showing a semiconductor device according to some example embodiments. In the embodiment that follows, a detailed description of technical features repetitive to those discussed above with reference to FIGS. 1 and 2A to 2D will be omitted, and only a difference thereof will be discussed in detail.

Referring to FIGS. 1 and 15, each of the first source/drain patterns SD1 may include a first semiconductor layer SL1 on the first recess RS1 and a second semiconductor layer SL2 on the first semiconductor layer SL1.

The first and second semiconductor layers SL1 and SL2 may include first conductive type impurities (e.g., phosphorus (P)). The impurity concentration of the second semiconductor layer SL2 may be greater than that of the first semiconductor layer SL1. The impurity concentration of the first semiconductor layer SL1 may range from about $5E19/cm^3$ to about $1E21/cm^3$. The impurity concentration of the second semiconductor layer SL2 may range from about $1E21/cm^3$ to about $1E23/cm^3$.

The first amorphous region AR1 may be in direct contact with the first semiconductor layer SL1. The first amorphous region AR1 may be spaced apart from the second semiconductor layer SL2 across the first semiconductor layer SL1, e.g., the first semiconductor layer SL1 may completely separate between the first amorphous region AR1 and the second semiconductor layer SL2.

FIGS. 16A, 16B, 16C, and 16D illustrate cross-sectional views respectively taken along lines A-A', B-B', and C-C' of FIG. 1, showing a semiconductor device according to some example embodiments. In the embodiment that follows, a detailed description of technical features repetitive to those discussed above with reference to FIGS. 1 and 2A to 2D will be omitted, and mainly a difference thereof will be discussed in detail.

Referring to FIGS. 1 and 16A to 16D, the substrate 100 may be provided with the first active region NR and the second active region PR. The device isolation layer ST may be provided on the substrate 100. The device isolation layer ST may define the first active patterns AP1 and the second active patterns AP2 on the upper portion of the substrate 100. The first active patterns AP1 and the second active patterns AP2 may be defined on the first active region NR and the second active region PR, respectively.

Each of the first active patterns AP1 may be provided thereon with first channel patterns CH1' that are stacked and spaced apart from each other. The first channel patterns CH1' stacked on the first active pattern AP1 may be spaced apart from each other in the third direction D3. The first channel patterns CH1' stacked on the first active pattern AP1 may vertically overlap each other.

Each of the second active patterns AP2 may be provided thereon with second channel patterns CH2' that are stacked and spaced apart from each other. The second channel patterns CH2' stacked on the second active pattern AP2 may be spaced apart from each other in the third direction D3. The second channel patterns CH2' stacked on the second active pattern AP2 may vertically overlap each other. The first and second channel patterns CH1' and CH2' may include, e.g., one or more of silicon (Si), germanium (Ge), and silicon-germanium (SiGe).

First source/drain patterns SD1 may be provided on each of the first active patterns AP1. First recesses RS1 may be formed on each of the first active patterns AP1, and the first source/drain patterns SD1 may correspondingly fill the first recesses RS1. The first channel patterns CH1' may be stacked between a pair of adjacent first source/drain patterns SD1. The stacked first channel patterns CH1' may connect the pair of adjacent first source/drain patterns SD1 to each other.

Second source/drain patterns SD2 may be provided on each of the second active patterns AP2. Second recesses RS2 may be formed on each of the second active patterns AP2, and the second source/drain patterns SD2 may correspondingly fill the second recesses RS2. The second channel patterns CH2' may be stacked between a pair of adjacent second source/drain patterns SD2. The stacked second channel patterns CH2' may connect the pair of adjacent second source/drain patterns SD2 to each other.

The first and second source/drain patterns SD1 and SD2 may be epitaxial patterns formed by a selective epitaxial growth process. The first source/drain pattern SD1 may be an epitaxial pattern formed from a seed layer, or from the first active pattern AP1 and the first channel patterns CH1' of the first recess RS1. The first source/drain pattern SD1 may be an n-type impurity region including Si.

The second source/drain pattern SD2 may be an epitaxial pattern formed from a seed layer, or from the second active pattern AP2 and the second channel patterns CH2' of the second recess RS2. The second source/drain pattern SD2 may be a p-type impurity region including SiGe.

The first active pattern AP1 may include the first amorphous regions AR1 below corresponding first source/drain patterns SD1. The second active pattern AP2 may include the second amorphous regions AR2 below corresponding second source/drain patterns SD2. A detailed description of the first and second amorphous regions AR1 and AR2 may be substantially the same as that of the first and second amorphous regions AR1 and AR2 discussed above with reference to FIGS. 1 and 2A to 2D.

The gate electrodes GE may be provided to extend in the first direction D1 and to run across the first and second channel patterns CH1' and CH2'. The gate electrode GE may vertically overlap the first and second channel patterns CH1' and CH2'. A pair of gate spacers GS may be disposed on opposite sidewalls of each of the gate electrodes GE. A gate capping pattern GP may be provided on the gate electrode GE.

Figure 16A:
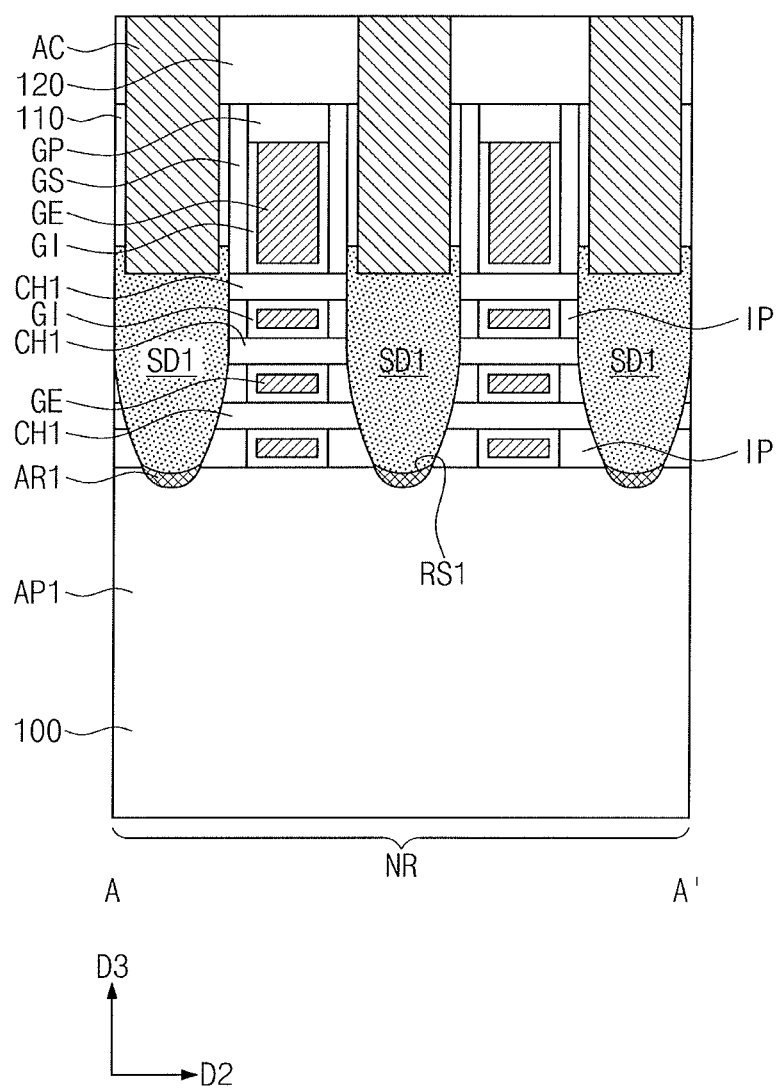
FIGS. 16A, 16B, 16C, and 16D illustrate cross-sectional views respectively taken along lines A-A', B-B', and C-C' of FIG. 1, showing a semiconductor device according to some example embodiments of the present inventive concepts.
Figure 16B:
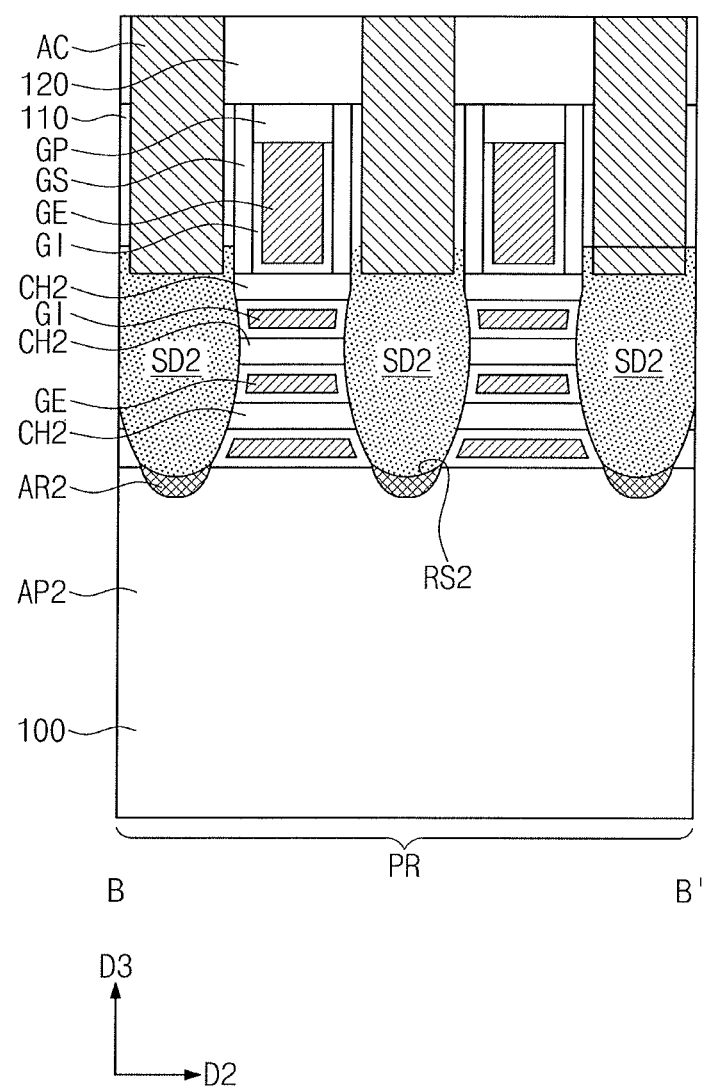
Figure 16C:
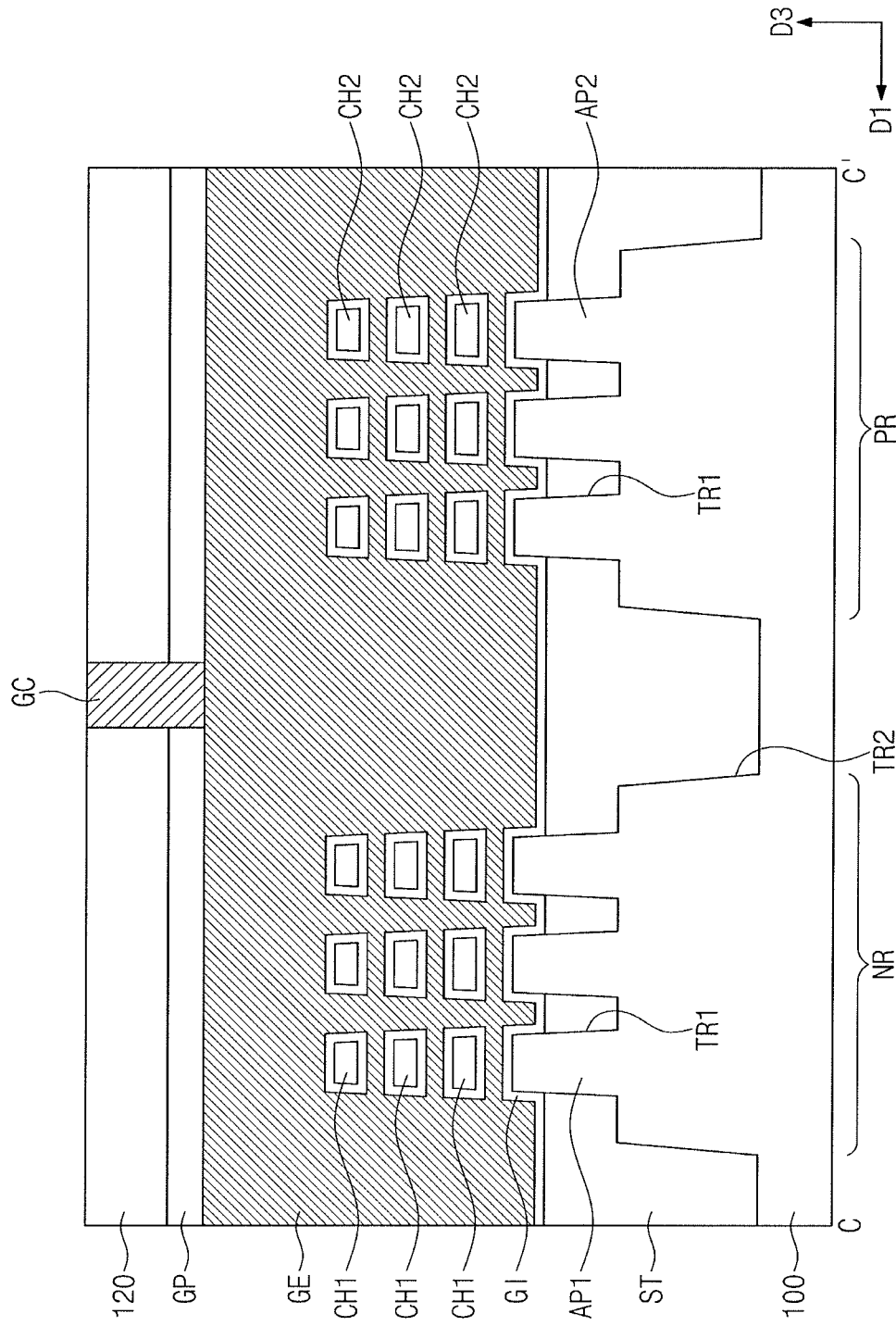
Figure 16D:
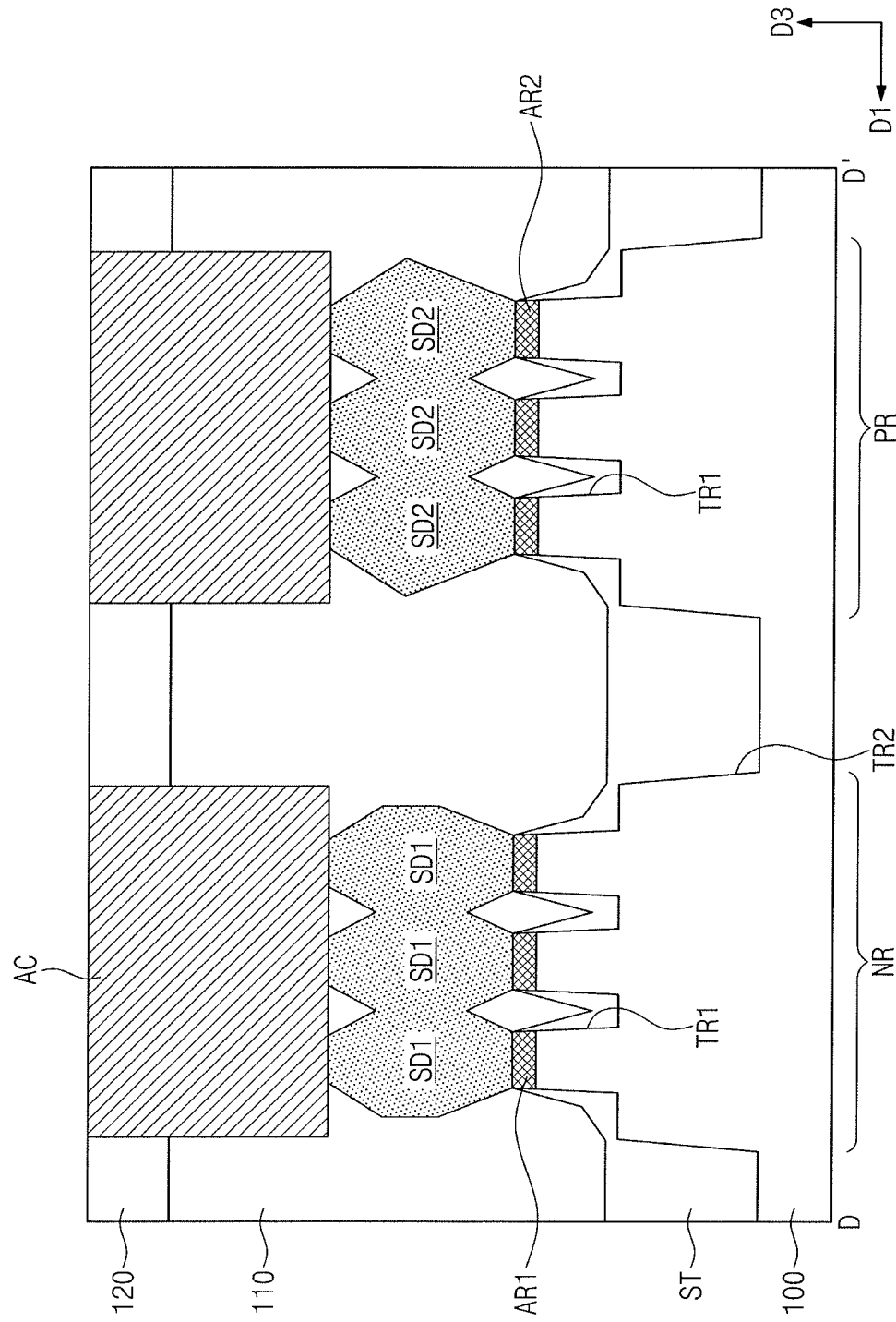

The gate electrode GE may surround each of the first and second channel patterns CH1' and CH2' (see FIG. 16C). For example, the gate electrode GE may surround a top surface, a bottom surface, and opposite sidewalls of each of the first and second channel patterns CH1' and CH2'. In such configurations, a transistor according to some embodiments may be a gate-all-around type field effect transistor.

The gate dielectric layer GI may be provided between the gate electrode GE and each of the first and second channel patterns CH1' and CH2'. The gate dielectric layer GI may surround a corresponding one of the first and second channel patterns CH1' and CH2'.

On the first active region NR, a dielectric pattern IP may be interposed between the gate dielectric layer GI and the first source/drain pattern SD1. The gate dielectric layer GI and the dielectric pattern IP may separate the gate electrode GE from the first source/drain pattern SD1. The dielectric pattern IP may be omitted on the second active region PR.

The first interlayer dielectric layer 110 and the second interlayer dielectric layer 120 may be provided on an entire surface of the substrate 100. The active contacts AC may be provided to penetrate the first and second interlayer dielectric layers 110 and 120 and to have a connection with the first and second source/drain patterns SD1 and SD2. The gate contact GC may be provided to penetrate the first and second interlayer dielectric layers 110 and 120, and to have a connection with the gate electrode GE.

By way of summation and review, a semiconductor device according to embodiments includes an amorphous region below a source/drain pattern. The amorphous region prevents an active pattern from receiving impurities diffused from the source/drain pattern. As a result, it is possible to prevent current leakage from the source/drain pattern toward the active pattern and to improve electrical characteristics of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate;
    a device isolation layer on the substrate, the device isolation layer defining a first active pattern;
    a pair of first source/drain patterns on the first active pattern, the pair of first source/drain patterns being spaced apart from each other in a first direction, and at least one of the pair of first source/drain patterns having a maximum first width in the first direction;
    a first channel pattern between the pair of first source/drain patterns;
    a gate electrode on the first channel pattern and extends in a second direction intersecting the first direction; and
    a first amorphous region in the first active pattern, the first amorphous region being below the at least one of the pair of first source/drain patterns, and having a maximum second width in the first direction that is less than the maximum first width.

2. The semiconductor device as claimed in claim 1, wherein:
    a top surface of the first amorphous region is in direct contact with a bottom surface of the at least one of the pair of first source/drain patterns, and
    the first amorphous region extends from the bottom surface of the at least one of the pair of first source/drain patterns toward a bottom surface of the substrate.

3. The semiconductor device as claimed in claim 1, wherein the first amorphous region vertically overlaps the at least one of the pair of first source/drain patterns.

4. The semiconductor device as claimed in claim 1, wherein:
    the first amorphous region has a first sidewall and a second sidewall that are spaced apart from each other in the second direction, and
    the first sidewall and the second sidewall are correspondingly aligned with sidewalls of the first active pattern, the sidewalls of the first active pattern being opposite to each other in the second direction.

5. The semiconductor device as claimed in claim 1, wherein the at least one of the pair of first source/drain patterns is in direct contact with the first channel pattern.

6. The semiconductor device as claimed in claim 1, wherein the first amorphous region includes a same semiconductor material as the first active pattern, the semiconductor material of the first active pattern being in a single crystalline state, and the semiconductor material of the first amorphous region being in an amorphous state.

7. The semiconductor device as claimed in claim 1, wherein the first amorphous region includes a first dopant, the first dopant being at least one of As, Ge, P, C, Si, N, and a combination thereof.

8. The semiconductor device as claimed in claim 7, wherein a concentration of the first dopant in the first amorphous region ranges from $1\text{E}19/\text{cm}^3$ to $1\text{E}22/\text{cm}^3$.

9. The semiconductor device as claimed in claim 1, wherein a top surface of the first channel pattern is higher than a top surface of the device isolation layer.

10. The semiconductor device as claimed in claim 1, further comprising:
    a pair of second source/drain patterns on a second active pattern, the pair of second source/drain patterns being spaced apart from each other in the first direction;
    a second channel pattern between the pair of second source/drain patterns; and
    a second amorphous region in the second active pattern, the second amorphous region being below at least one of the pair of second source/drain patterns,
    wherein the at least one of the pair of first source/drain patterns is an impurity region of a first conductive type, and
    wherein the at least one of the pair of second source/drain patterns is an impurity region of a second conductive type.

11. A semiconductor device, comprising:
    a substrate;
    a device isolation layer on the substrate, the device isolation layer defining an active pattern, and the active pattern extending in a first direction;
    a channel pattern on the active pattern, a top surface of the channel pattern being higher than a top surface of the device isolation layer;
    a source/drain pattern on the active pattern, the source/drain pattern including a region with a maximum first width in the first direction, and the source/drain pattern being in direct contact with the channel pattern;
    a gate electrode on the channel pattern and extends in a second direction intersecting the first direction; and
    an amorphous region in the active pattern, the amorphous region being below the source/drain pattern.

12. The semiconductor device as claimed in claim 11, wherein the maximum first width of the source/drain pattern is larger than a maximum second width in the first direction of the amorphous region.

13. The semiconductor device as claimed in claim 11, wherein:
the amorphous region has a first sidewall and a second sidewall that are opposite to each other in the second direction, and
the first sidewall and the second sidewall are correspondingly aligned with sidewalls of the active pattern, the sidewalls of the active pattern being opposite to each other in the second direction.

14. The semiconductor device as claimed in claim 11, wherein the amorphous region includes a same semiconductor material as the active pattern, the semiconductor material of the active pattern having a single crystalline structure, and the semiconductor material of the amorphous region having an amorphous structure.

15. The semiconductor device as claimed in claim 11, wherein the amorphous region includes a dopant, the dopant being at least one of As, Ge, P, C, Si, N, and a combination thereof, and a concentration of the dopant in the amorphous region ranging from $1E19/cm^3$ to $1E22/cm^3$.

16. A semiconductor device, comprising:
a substrate;
a device isolation layer on the substrate, the device isolation layer defining an active pattern, and an upper portion of the active pattern vertically protruding above the device isolation layer;
a pair of source/drain patterns on the upper portion of the active pattern, the pair of source/drain patterns being spaced apart from each other in a first direction;
a channel pattern between the pair of source/drain patterns;
a gate electrode on a top surface and opposite sidewalls of the channel pattern, the gate electrode extending in a second direction intersecting the first direction;
a gate dielectric layer between the channel pattern and the gate electrode, the gate dielectric layer covering the top surface and the opposite sidewalls of the channel pattern;
an active contact electrically connected to at least one of the pair of source/drain patterns, the at least one of the pair of source/drain patterns having a maximum first width in the first direction; and
an amorphous region in the active pattern, the amorphous region being below the at least one of the pair of source/drain patterns, and having a maximum second width in the first direction that is less than the maximum first width.

17. The semiconductor device as claimed in claim 16, wherein:
the amorphous region has a first sidewall and a second sidewall spaced apart from each other in the second direction, and
the first sidewall and the second sidewall are correspondingly aligned with sidewalls of the active pattern, the sidewalls of the active pattern being opposite to each other in the second direction.

18. The semiconductor device as claimed in claim 17, wherein the first and second sidewalls are covered with a dielectric material.

19. The semiconductor device as claimed in claim 16, wherein the amorphous region includes a same material as the active pattern, the material of the active pattern being a semiconductor material with a single crystalline structure, and the material of the amorphous region being a semiconductor material with an amorphous structure.

20. The semiconductor device as claimed in claim 16, wherein the at least one of the pair of source/drain patterns is in direct contact with the channel pattern.

* * * * *